(12) United States Patent
Kondoh

(10) Patent No.: US 7,119,366 B2
(45) Date of Patent: Oct. 10, 2006

(54) SEMICONDUCTOR DEVICE, EL DISPLAY DEVICE, LIQUID CRYSTAL DISPLAY DEVICE, AND CALCULATING DEVICE

(75) Inventor: Hiroshi Kondoh, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 188 days.

(21) Appl. No.: 10/618,650

(22) Filed: Jul. 15, 2003

(65) Prior Publication Data
US 2004/0061141 A1    Apr. 1, 2004

(30) Foreign Application Priority Data

| | | |
|---|---|---|
| Jul. 22, 2002 | (JP) | ............... 2002-212685 |
| Jun. 11, 2003 | (JP) | ............... 2003-166765 |
| Jul. 3, 2003 | (JP) | ............... 2003-190877 |

(51) Int. Cl.
H01L 29/04    (2006.01)
G02F 1/1333    (2006.01)

(52) U.S. Cl. ............ 257/59; 257/72; 257/E39.007; 257/E51.007

(58) Field of Classification Search ............ 349/138, 349/122; 257/8, 16, 20, 24, 40, 191, 192, 257/59, 72, E39.007, E51.007
See application file for complete search history.

(56) References Cited

U.S. PATENT DOCUMENTS

| | | | | |
|---|---|---|---|---|
| 5,355,235 | A | * | 10/1994 | Nishizawa et al. ......... 349/43 |
| 5,500,537 | A | | 3/1996 | Tsumura et al. |
| 5,835,837 | A | | 11/1998 | Saitoh et al. |
| 5,892,244 | A | * | 4/1999 | Tanaka et al. .............. 257/40 |
| 6,060,333 | A | * | 5/2000 | Tanaka et al. .............. 438/30 |
| 6,068,953 | A | | 5/2000 | Matsumoto et al. |
| 6,278,127 | B1 | * | 8/2001 | Dodabalapur et al. ...... 257/40 |
| 6,414,732 | B1 | | 7/2002 | Matsumoto et al. |
| 6,493,529 | B1 | | 12/2002 | Umemura et al. |
| 6,836,067 | B1 | | 12/2004 | Imai |
| 2002/0135555 | A1 | * | 9/2002 | Yang et al. .............. 345/98 |
| 2003/0111692 | A1 | | 6/2003 | Toguchi et al. |

FOREIGN PATENT DOCUMENTS

| | | |
|---|---|---|
| EP | 0 418 504 | 3/1991 |
| EP | 0 546 665 | 6/1993 |
| WO | WO 02/15293 | 2/2002 |

OTHER PUBLICATIONS

A. Dodabalapur, et al., Device Research Conference, XP-010162133, pp. 132-133, "Heterojunction Organic Thin-Film Transistors", Jun. 19, 1995.

(Continued)

*Primary Examiner*—Long Tran
(74) *Attorney, Agent, or Firm*—Oblon, Spivak, McClelland, Maier & Neustadt, P.C.

(57) ABSTRACT

There is provided a semiconductor device able to increase the mobility of carriers and reduce the current in the OFF state. The semiconductor device includes a gate electrode, an insulating layer on the gate electrode, a first electrode on the insulating layer, a second electrode on the insulating layer at an interval with the first electrode, an organic semiconductor layer disposed in the interval between the first electrode and the second electrode and covering at least part of the first electrode and the second electrode, and a first resistance layer formed on the organic semiconductor layer and having an electrical resistance lower than that of the organic semiconductor layer. The first resistance layer is formed from conductive polymers.

30 Claims, 17 Drawing Sheets

OTHER PUBLICATIONS

J. H. Schoen, et al., Applied Physics Letters, vol. 80, No. 5, XP-001101663, pp. 847-849, "Nanoscale Organic Transistors Based on Self-Assembled Monolayers", Feb. 4, 2002.

Z. Bao, et al., Applied Physics Letters, vol. 69, No. 26, pp. 4108-4110, "Soluble and Processable Regioregular Poly(3-Hexylthiophene) for Thin Film Field-Effect Transistor Applications With High Mobility", Dec. 23, 1996.

J. Collet, et al., Applied Physics Letters, vol. 76, No. 14, pp. 1941-1943, "Low-Voltage, 30 nm Channel Length, Organic Transistors With a Self-Assembled Monolayer as Gate Insulating Films", Apr. 3, 2000.

U.S. Appl. No. 11/287,325, filed Nov. 28, 2005, Kondo et al.

U.S. Appl. No. 11/319,063, filed Dec. 28, 2005, Kondo et al.

* cited by examiner

LIGHT EMISSION

FIG.24

| | 2ND POWER SUPPLY (V) | 1ST POWER SUPPLY (V) | CURRENT (A) |
|---|---|---|---|
| 1ST EXAMPLE | 0 | 0 | $6.48 \times 10^{-10}$ |
| | | 2 | $1.51 \times 10^{-4}$ |
| | | 4 | $2.69 \times 10^{-4}$ |
| | | 8 | $4.08 \times 10^{-4}$ |
| | -4 | 0 | $7.95 \times 10^{-10}$ |
| | | 2 | $5.22 \times 10^{-4}$ |
| | | 4 | $9.89 \times 10^{-4}$ |
| | | 8 | $1.93 \times 10^{-3}$ |
| | -8 | 0 | $9.17 \times 10^{-10}$ |
| | | 2 | $1.06 \times 10^{-3}$ |
| | | 4 | $1.80 \times 10^{-3}$ |
| | | 8 | $3.83 \times 10^{-3}$ |
| 2ND EXAMPLE | 0 | 0 | $1.25 \times 10^{-9}$ |
| | | 2 | $2.76 \times 10^{-4}$ |
| | | 4 | $5.44 \times 10^{-4}$ |
| | | 8 | $9.14 \times 10^{-4}$ |
| | -4 | 0 | $2.00 \times 10^{-9}$ |
| | | 2 | $7.79 \times 10^{-4}$ |
| | | 4 | $1.40 \times 10^{-3}$ |
| | | 8 | $2.75 \times 10^{-3}$ |
| | -8 | 0 | $3.31 \times 10^{-9}$ |
| | | 2 | $1.48 \times 10^{-3}$ |
| | | 4 | $3.16 \times 10^{-3}$ |
| | | 8 | $5.70 \times 10^{-3}$ |
| EXAMPLE FOR COMPARISON | 0 | 0 | $2.08 \times 10^{-11}$ |
| | | 4 | $4.47 \times 10^{-10}$ |
| | | 8 | $8.01 \times 10^{-10}$ |
| | | 12 | $1.11 \times 10^{-9}$ |
| | -8 | 0 | $5.59 \times 10^{-11}$ |
| | | 4 | $1.02 \times 10^{-9}$ |
| | | 8 | $1.79 \times 10^{-9}$ |
| | | 12 | $2.31 \times 10^{-9}$ |
| | -12 | 0 | $8.50 \times 10^{-11}$ |
| | | 4 | $2.12 \times 10^{-9}$ |
| | | 8 | $3.99 \times 10^{-9}$ |
| | | 12 | $5.95 \times 10^{-9}$ |

FIG.25

|  | 2ND POWER SUPPLY | INITIAL VALUE (A) | VALUE IN 10 HRS (A) |
|---|---|---|---|
| 3RD EXAMPLE | 0V | $6.40 \times 10^{-6}$ | $9.55 \times 10^{-5}$ |
| | -8V | $2.34 \times 10^{-4}$ | $6.01 \times 10^{-4}$ |
| 4TH EXAMPLE | 0V | $8.45 \times 10^{-7}$ | $1.00 \times 10^{-6}$ |
| | -8V | $9.11 \times 10^{-5}$ | $1.23 \times 10^{-4}$ |

FIG.26

|  | 2ND POWER SUPPLY (V) | 1ST POWER SUPPLY (V) | CURRENT (A) |
|---|---|---|---|
| 5TH EXAMPLE | 0 | 0 | $2.34 \times 10^{-11}$ |
| | | 2 | $5.75 \times 10^{-6}$ |
| | | 4 | $1.01 \times 10^{-5}$ |
| | | 8 | $1.96 \times 10^{-5}$ |
| | -4 | 0 | $4.06 \times 10^{-11}$ |
| | | 2 | $3.14 \times 10^{-5}$ |
| | | 4 | $5.99 \times 10^{-5}$ |
| | | 8 | $1.46 \times 10^{-4}$ |
| | -8 | 0 | $5.34 \times 10^{-11}$ |
| | | 2 | $7.02 \times 10^{-5}$ |
| | | 4 | $2.00 \times 10^{-4}$ |
| | | 8 | $4.04 \times 10^{-4}$ | ically-neutral organic semiconductor layer 205 (channel region), and are arranged in the same plane. The gate electrode 201 is electrically separated from the organic semiconductor layer 205 by a gate insulating layer 202.

SEMICONDUCTOR DEVICE, EL DISPLAY DEVICE, LIQUID CRYSTAL DISPLAY DEVICE, AND CALCULATING DEVICE

BACKGROUND OF THE INVENTION

1. Field of the Invention

The present invention relates to a semiconductor device able to improve a mobility of carriers, and an EL (electroluminescent) display device, a liquid crystal display device, and a calculating device utilizing the semiconductor device.

2. Description of the Related Art

There are various kinds of display apparatuses in the related art, and CRT (cathode-ray tube) displays, liquid crystal displays, and EL (electroluminescence) displays are typical ones. The CRT displays are widely used so far because of their high display quality and lower manufacturing cost. Nevertheless, a CRT display suffers from the difficulties of reducing the size and lowering the electric power consumption of the cathode-ray tube. For these reasons, demand for the liquid crystal displays and the EL displays rapidly increases. Especially, because of such features as self-emitting, low driving voltages, and high brightness, more and more expectations are placed on the organic EL display devices used in the EL displays.

The liquid crystal displays are widely used because of their good visibility and fast responding performance. Meanwhile, the EL displays, which exhibit good visibility and responding performance, are also being widely spread gradually. Further, the liquid crystal displays and the EL displays both have lower power consumption than that of the CRT displays.

In the above displays, one of the commonly used active devices is a transistor including an organic semiconductor layer, a source electrode (first electrode), a drain electrode (second electrode), and a gate electrode (third electrode). FIG. 27 and FIG. 28 are sectional views each showing a TFT (Thin Film Transistor), specifically, a thin film FET (Field Effect Transistor) of the related art.

In the thin film FET shown in FIG. 27, a source electrode 203 and a drain electrode 204 are separated by an electrically-neutral organic semiconductor layer 205 (channel region), and are arranged in the same plane. The gate electrode 201 is electrically separated from the organic semiconductor layer 205 by a gate insulating layer 202.

In the thin film FET shown in FIG. 28, a source electrode 213 and a drain electrode 214 are arranged to be separated at a distance in the same plane on an organic semiconductor layer 215. The gate electrode 211 is electrically separated from the organic semiconductor layer 215 by a gate insulating layer 212.

In these thin film FETs of the related art, the organic semiconductor layer can be formed by coating, so it is possible to largely reduce the fabricating cost. However, there exists a problem in that the charge mobility of an organic semiconductor material is much lower than that of an inorganic semiconductor material. In recent years, the organic semiconductor material Polythiophene is found to be of high charge mobility (Applied Physics Letter, vol. 69. p 4108(1996)), and therefore is attracting attention, but its charge mobility is less than 0.1 (cm$^2$/V·sec) about one order of magnitude lower than that of the current amorphous silicon. Furthermore, the switching speed of an active device using the organic semiconductor material generally is of the order of KHz, and is not suitable for driving devices for displaying fine motion pictures.

In the related art, in order to increase the switching speed of an active device, in addition to improving the mobility of an organic semiconductor material, attempts have also been made in shortening the channel length of the active device. It was considered that the current flowing in the semiconductor layer would increase if the channel length was shortened, and thus the organic thin film transistor (TFT) could be used to drive an EL display. However, in order to pattern a channel length (that is, the source-drain distance) less than a few μm, complicated photolithography processing is needed, and thus the fabricating costs goes up.

To solve this problem, the static induction transistor (SIT), in which a source electrode, a gate electrode, and a drain electrode are stacked vertically in sequence, was presented in the ninth lecture course of Bioelectronics Division of Applied Physics Association (2001).

FIGS. 29A and 29B are sectional views showing static induction transistors (SIT) of the related art. FIG. 29A shows a state in which a voltage is not applied, and FIG. 29B shows a state in which a voltage is applied and a depletion region is formed. As shown in FIGS. 29A and 29B, in a SIT active device of the related art, a source electrode 223, an organic semiconductor layer 225, and a drain electrode 224 are stacked vertically in sequence, and in the center portion of the organic semiconductor layer 225, several rod-shaped gate electrodes 222 are formed in a row at certain intervals and approximately in parallel with the source electrode 223 and the drain electrode 224. With this compound organic EL transistor, as shown in FIG. 29B, if a gate voltage is applied to the gate electrode 222, the depletion region in the organic semiconductor layer 225 expands, and the resistance between the source electrode 223 and the drain electrode 224 increases, thereby the current between the gate electrode 222 and the drain electrode 224 is switched ON or OFF. With such an SIT, the area of the active device can be reduced.

As shown in FIGS. 29A and 29B, because the channel length of the SIT can be controlled by using the film thickness of the semiconductor layer, it is possible to form a thin semiconductor layer by coating or other film fabrication techniques, so the SIT is expected to work as a transistor capable of fast response in the future.

Turning to the problem addressed by the present invention, however, in the above SIT, when a gate voltage is not applied to the gate electrode 222, a current flows between the source electrode 223 and the drain electrode 224; when a gate voltage is applied to the gate electrode 222, the current between the source electrode 223 and the drain electrode 224 is switched off (that is, such a SIT is a normally ON type transistor).

Further, with the current film fabrication technique, the film thickness of the organic semiconductor layer 225 is thicker than that of the organic semiconductor layer 215 in the TFT of the related art as shown in FIG. 28, and as a result, the channel length between the source electrode 223 and the drain electrode 224 in the above SIT is shorter than that of the TFT of the related art. Therefore, in the SIT, the resistance between the source electrode 223 and the drain electrode 224 decreases, and there arises a problem in that the current in an OFF state is large.

SUMMARY OF THE INVENTION

Accordingly, it is a general object of the present invention to solve the above problems of the related art.

A more specific object of the present invention is to provide a semiconductor device able to increase a mobility of carriers and reduce a current in an OFF state, and an EL display device, a liquid crystal display device, and a calculating device utilizing the semiconductor device.

To attain the above object, according to a first aspect of the present invention, there is provided a semiconductor device comprising a gate electrode, an insulating layer on the gate electrode, a first electrode on the insulating layer, a second electrode on the insulating layer at an interval with the first electrode, an organic semiconductor layer disposed in the interval between the first electrode and the second electrode and covering at least part of the first electrode and the second electrode, and a first resistance layer formed on the organic semiconductor layer and having an electrical resistance lower than an electrical resistance of the organic semiconductor layer.

In the above semiconductor device, preferably, both a distance from the first electrode to the first resistance layer, and a distance from the second electrode to the first resistance layer are shorter than the interval between the first electrode and the second electrode.

Further, one of the first electrode and the second electrode may be in contact with the first resistance layer.

Further, the semiconductor device further comprises a second resistance layer formed at least at one of the position between the first resistance layer and the organic semiconductor layer, the position between the first electrode and the organic semiconductor layer, and the position between the second electrode and the organic semiconductor layer, wherein the second resistance layer has an electrical resistance so that carriers in the organic semiconductor layer are allowed to tunnel through the second resistance layer when a voltage of a predetermined value or more than the predetermined value is applied across the second resistance layer.

Preferably, in the above semiconductor device, at least one of the first electrode, the second electrode and the first resistance layer is in contact with the organic semiconductor layer, and an interface between one of the first electrode, the second electrode and the first resistance layer rectifies an electrical current therethrough.

Further, the first resistance layer may be formed to be one of a plate shape, an inter-digital shape, a grating shape, and a disk shape.

Further, a substrate may be beneath the gate electrode.

Preferably, the organic semiconductor layer is formed from at least one organic material selected from the group consisting of poly(N-vinylcarbazole) derivatives, poly(γ-(carbazolylethyl)glutamate) derivatives, poly(vinylphenanthrene) derivatives, polysilane derivatives, oxazole derivatives, oxadiazole derivatives, imidazole derivatives, arylamine derivatives such as monoarylamine derivatives and triarylamine derivatives, benzidine derivatives, diarylmethane derivatives, triarylmethane derivatives, styrylanthracene derivatives, pyrazoline derivatives, divinylbenzene derivatives, hydrazone derivatives, indene derivatives, indenone derivatives, butadiene derivatives, pyrene derivatives such as pyrenefolmaldehyde and poly(vinylpyrene), stilbene derivatives such as α-phenylstilbene derivatives, and bis-stilbene derivatives, enamine derivatives, fluorenone and derivatives thereof, poly(fluorenone) and derivatives thereof, and thiophene derivatives such as poly(alkylthiophene), or at least one organic material selected from the group consisting of pentacene, tetracene, bis-azo pigments, tris-azo pigments, poly-azo pigments, triarylmethane-based pigments, thiazine-based pigments, oxazine-based pigments, xanthene-based pigments, cyanine pigments, styryl pigments, pyrylium-based pigments, quinacridone-based pigments, indigo-based pigments, perylene-based pigments, polycyclic quinone-based pigments, bis(benzimidazole)-based pigments, indanthrone-based pigments, squarylium-based pigments, anthraquinone-based pigments, and phthalocyanine-based pigments such as copper phthalocyanine and titanylphthalocyanine.

Preferably, the first resistance layer is formed from at least one electrically conductive material of polyacetylene-based electrically conductive polymers, polyphenylene-based electrically conductive polymers such as poly(para-phenylene) and derivatives thereof and poly(phenylene vinylene) and derivatives thereof, heterocyclic electrically conductive polymers such as polypyrrole and derivatives thereof, polythiophene and derivatives thereof, poly(ethylenedioxythiophene) and derivatives thereof, and polyfuran and derivatives thereof, ionic electrically conductive polymers such as polyaniline and derivatives thereof, and metals of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn).

Preferably, the first resistance layer includes at least one dopant with a low vapor pressure including one or more poly(sulfonic acid), poly(styrenesulfonic acid), naphthalenesulfonic acid, and alkylnaphthalenesulfonic acid.

Preferably, each of the first electrode, the second electrode, and the gate electrode is formed from at least one or more metals of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn), or at least one electrically conductive polymer selected from the group including polyacetylene-based electrically conductive polymers, polyphenylene-based electrically conductive polymers such as poly(paraphenylene) and derivatives thereof and poly(phenylene vinylene) and derivatives thereof, heterocyclic electrically conductive polymers such as polypyrrole and derivatives thereof, polythiophene and derivatives thereof, poly(ethylenedioxythiophene) and derivatives thereof, and polyfuran and derivatives thereof, and ionic electrically conductive polymers such as polyaniline and derivatives thereof.

Preferably, the insulating layer is formed from at least one resin selected from the group consisting of thermoplastic resins such as styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate) polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or a metal oxide produced via oxidation of a surface of an electrode layer formed from the metal.

Preferably, the insulating layer is formed from a metal oxide film produced by coating and baking a solution obtained via hydrolysis of a metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

Preferably, the second resistance layer is formed from at least one resin selected from the group consisting of thermoplastic resins such as styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or a metal oxide produced via oxidation of a surface of at least one of the first electrode and the second electrode.

Preferably, the second resistance layer is formed from a metal oxide film produced by coating and baking a solution obtained via hydrolysis of a metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

Preferably, the organic semiconductor layer includes a dielectric material. More preferably, the dielectric material is selected from styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, a metal oxide film produced by baking a solution obtained via hydrolysis of a metal alkoxide represented by one of the general formulas $M(OR)_n$ and $MR(OR')_{n-1}$, in which each of R and R' is an organic group such as an alkyl group and a phenyl group, M is a metal in one of IVA through VIIA groups, VIII group, and IB through VIB groups of the periodic table, and n is an ionic valence of the metal M, an oxide of one of Al, Ta, W, and Si, and a nitride of Si.

To attain the above object, according to a second aspect of the present invention, there is provided a semiconductor device comprising a first electrode, a second electrode at an interval with the first electrode, an organic semiconductor layer disposed in the interval between the first electrode and the second electrode and covering at least part of the first electrode and the second electrode, a first resistance layer formed on the organic semiconductor layer and having an electrical resistance lower than an electrical resistance of the organic semiconductor layer, an insulating layer on the first resistance layer, and a gate electrode on the insulating layer.

Preferably, the semiconductor device further comprises a second resistance layer formed on at least one of an interface between the first resistance layer and the organic semiconductor layer, an interface between the first electrode and the organic semiconductor layer, and an interface between the second electrode and the organic semiconductor layer; the second resistance layer has a resistance so that carriers in the organic semiconductor layer are allowed to tunnel through the second resistance layer when a voltage of a predetermined value or more than the predetermined value is applied across the second resistance layer.

Further, a substrate may be beneath the first electrode, the second electrode and the organic semiconductor layer.

To attain the above object, according to a third aspect of the present invention, there is provided a semiconductor device comprising an organic semiconductor layer, a first resistance layer beneath the organic semiconductor layer and having an electrical resistance lower than an electrical resistance of the organic semiconductor layer, a first electrode on the organic semiconductor layer, a second electrode on the organic semiconductor layer at an interval with the first electrode, an insulating layer disposed in the interval between the first electrode and the second electrode and covering the first electrode and the second electrode, and a gate electrode on the insulating layer, wherein the first resistance layer has an electrical resistance lower than an electrical resistance of the organic semiconductor layer.

Preferably, the semiconductor device further comprises a second resistance layer formed on at least one of an interface between the first resistance layer and the organic semiconductor layer, an interface between the first electrode and the organic semiconductor layer, and an interface between the second electrode and the organic semiconductor layer; the second resistance layer has a resistance so that carriers in the organic semiconductor layer are allowed to tunnel through the second resistance layer when a voltage of a predetermined value or more than the predetermined value is applied across the second resistance layer.

Further, a substrate may be beneath the first resistance layer.

To attain the above object, according to a fourth aspect of the present invention, there is provided a semiconductor device comprising a gate electrode, an insulating layer on the gate electrode, a first resistance layer on the insulating layer, an organic semiconductor layer on the first resistance layer, a first electrode on the organic semiconductor layer, and a second electrode on the organic semiconductor layer at an interval with the first electrode, wherein the first resistance layer has an electrical resistance lower than an electrical resistance of the organic semiconductor layer.

Preferably, in the above semiconductor device, two opposite ends of the first resistance layer may be covered by the organic semiconductor layer.

Further, the above semiconductor device further includes a second resistance layer formed at least at one of the position between the first resistance layer and the organic semiconductor layer, the position between the first electrode and the organic semiconductor layer, and the position between the second electrode and the organic semiconductor layer, wherein the second resistance layer has an electrical resistance so that carriers in the organic semiconductor layer are allowed to tunnel through the second resistance layer when a voltage of a predetermined value or more than the predetermined value is applied across the second resistance layer.

To attain the above object, according to a fifth aspect of the present invention, there is provided an electroluminescent display device, comprising a plurality of semiconductor devices, each semiconductor device including a gate electrode, an insulating layer on the gate electrode, a first electrode on the insulating layer, a second electrode on the insulating layer at an interval with the first electrode, an organic semiconductor layer disposed in the interval between the first electrode and the second electrode and covering at least part of the first electrode and the second electrode, and a first resistance layer formed on the organic semiconductor layer and having an electrical resistance lower than an electrical resistance of the organic semiconductor layer.

To attain the above object, according to a sixth aspect of the present invention, there is provided an electroluminescent display device including a plurality of semiconductor devices and a plurality of light emitting elements arranged in a matrix manner on a substrate, each of the semiconductor devices comprising a gate electrode on the substrate, an insulating layer covering ends and a surface of the gate electrode, a first electrode on the insulating layer, a second electrode on the insulating layer at an interval with the first electrode, an organic semiconductor layer disposed in the interval between the first electrode and the second electrode and covering at least part of the first electrode and the second electrode, and a first resistance layer formed on the organic semiconductor layer and having an electrical resistance lower than an electrical resistance of the organic semiconductor layer; the light emitting element comprising a transparent electrode on the substrate, an electroluminescent layer on the transparent electrode, and a cathode on the electroluminescent layer, wherein the first electrode is electrically connected with the transparent electrode.

To attain the above object, according to a seventh aspect of the present invention, there is provided a liquid crystal display device comprising a semiconductor device including a gate electrode, an insulating layer on the gate electrode, a first electrode on the insulating layer, a second electrode on the insulating layer at an interval with the first electrode, an organic semiconductor layer disposed in the interval between the first electrode and the second electrode and covering at least part of the first electrode and the second electrode, and a first resistance layer formed on the organic semiconductor layer and having an electrical resistance lower than an electrical resistance of the organic semiconductor layer.

To attain the above object, according to an eighth aspect of the present invention, there is provided a calculating device, comprising at least one of a NOT circuit, a NAND circuit, and a NOR circuit each including a plurality of semiconductor devices, each of the semiconductor devices including a gate electrode, an insulating layer on the gate electrode, a first electrode on the insulating layer, a second electrode on the insulating layer at an interval with the first electrode, an organic semiconductor layer disposed in the interval between the first electrode and the second electrode and covering at least part of the first electrode and the second electrode, and a first resistance layer formed on the organic semiconductor layer and having an electrical resistance lower than an electrical resistance of the organic semiconductor layer.

These and other objects, features, and advantages of the present invention will become more apparent from the following detailed description of preferred embodiments given with reference to the accompanying drawings.

BRIEF DESCRIPTION OF THE DRAWINGS

FIG. 2A shows an active device having a plate-shaped low resistance layer, and FIG. 2B shows an active device having an inter-digital shaped low resistance layer;

FIG. 21A shows a NOT circuit, FIG. 21B shows a NAND circuit, and FIG. 21C shows a NOR circuit;

FIG. 24 is a view of a table showing evaluation results of the first and the second examples of the active device of the present invention;

FIG. 25 is a view of a table showing evaluation results of the third and the fourth examples of the active device of the present invention;

FIG. 26 is a view of a table showing evaluation results of the fifth example of the active device of the present invention;

DESCRIPTION OF THE PREFERRED EMBODIMENTS

Figure 1:
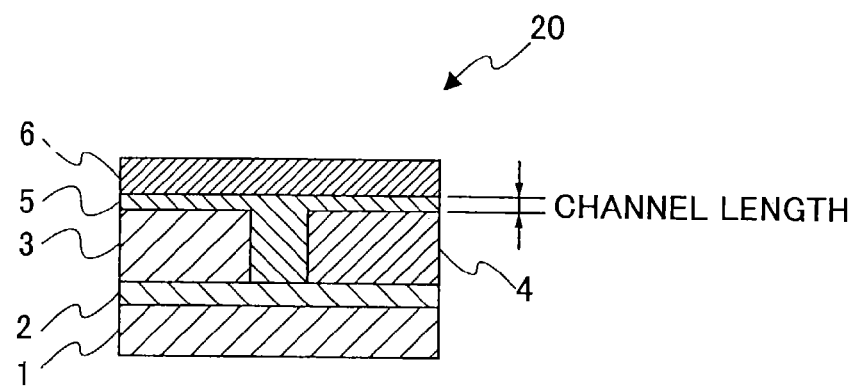
FIG. 1 is a sectional view showing a configuration of an active device 20 according to a first embodiment of the present invention.

Below, preferred embodiments of the present invention will be explained with reference to the accompanying drawings. Note that in the following descriptions, the same reference numerals are used for the same elements, the elements indicated by the same reference numerals are formed from the same materials, and the overlapping descriptions are omitted.

The First Embodiment

FIG. 1 shows a sectional view of an active device 20 according to a first embodiment of the present invention.

As shown in FIG. 1, the active device 20 includes a gate electrode 1, an insulating layer 2 (gate insulating film) on the gate electrode 1, a first electrode 3 (source electrode) and a second electrode 4 (drain electrode) on the insulating layer 2 arranged at an interval in the same plane, an organic semiconductor layer 5 disposed in the interval between the source electrode 3 and the drain electrode 4 and covering the upper surfaces of the source electrode 3 and the drain electrode 4, and a low resistance layer 6 having an electrical resistance lower than that of the organic semhiconductor layer 5 and formed above the organic semiconductor layer 5.

Figure 2A:
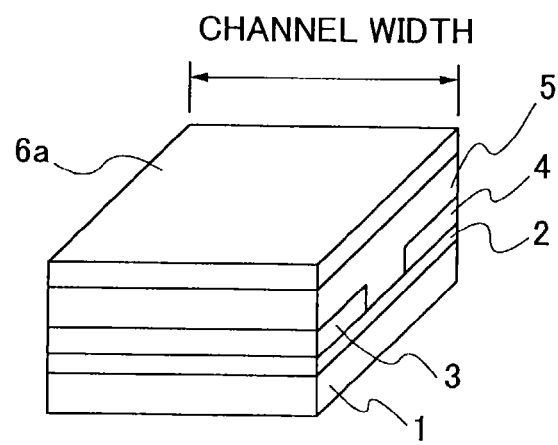
FIGS. 2A and 2B are perspective views of active devices according to the first embodiment of the present invention, where
Figure 2B:
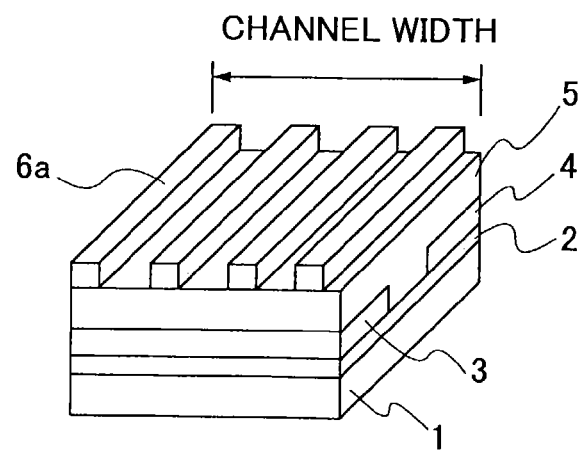

FIGS. 2A and 2B are perspective views of examples of the active device according to the first embodiment of the present invention.

Preferably, the low resistance layer 6 is a plate-shaped layer 6a as shown in FIG. 2A, or an inter-digital shaped layer 6b as shown in FIG. 2B, or, although not illustrated, it can be formed to have a grating shape, or a disk shape.

Preferably, the low resistance layer 6 is formed from, for example, at least one electrically conductive material selected from the group including polyacetylene-based electrically conductive polymers, polyphenylene-based electrically conductive polymers such as poly(para-phenylene) and derivatives thereof and poly(phenylene vinylene) and derivatives thereof, heterocyclic electrically conductive polymers such as polypyrrole and derivatives thereof, polythiophene and derivatives thereof, poly(ethylenedioxythiophene) and derivatives thereof, and polyfuran and derivatives thereof, ionic electrically conductive polymers such as polyaniline and derivatives thereof, and metals of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn).

The above-mentioned electrically conductive polymer may include, for example, at least one dopant with a low vapor pressure selected from the group including poly(sulfonic acid), poly(styrenesulfonic acid), naphthalenesulfonic acid, and alkylnaphthalenesulfonic acid.

As will be appreciated, the low resistance layer 6 may also be formed from other materials that realize the effects of the present invention.

As shown above, since the low resistance layer 6 is formed from conductive polymers, coating can be used to form the low resistance layer 6, and this can effectively reduce the costs of the manufacturing equipment and the device. In case the low resistance layer 6 is formed from the metals mentioned above, the same effect as the above is achievable by forming the low resistance layer 6 by coating using a coating solution prepared by making the metals into highly fine particles and dispersing the fine particles in water or an organic solvent.

In addition, the low resistance layer 6 may also be formed by after-treatment. For example, when using the semiconductor material which is found to be conductive after oxygen being doped, the low resistance layer 6 can be formed on the surface of the organic semiconductor layer 5 after the surface of the organic semiconductor layer 5 is heat-treated in an oxygen atmosphere.

Preferably, the organic semiconductor layer 5 is formed from, for example, at least one organic material selected from the group consisting of poly(N-vinylcarbazole) derivatives, poly(γ-(carbazolylethyl)glutamate) derivatives, poly (vinylphenanthrene) derivatives, polysilane derivatives, oxazole derivatives, oxadiazole derivatives, imidazole derivatives, arylamine derivatives such as monoarylamine derivatives and triarylamine derivatives, benzidine derivatives, diarylmethane derivatives, triarylmethane derivatives, styrylanthracene derivatives, pyrazoline derivatives, divinylbenzene derivatives, hydrazone derivatives, indene derivatives, indenone derivatives, butadiene derivatives, pyrene derivatives such as pyrenefolmaldehyde and poly (vinylpyrene), stilbene derivatives such as α-phenylstilbene derivatives, and bis-stilbene derivatives, enamine derivatives, fluorenone and derivatives thereof, poly(fluorenone) and derivatives thereof, and thiophene derivatives such as poly(alkylthiophene), or at least one organic material selected from the group consisting of pentacene, tetracene, bis-azo pigments, tris-azo pigments, poly-azo pigments, triarylmethane-based pigments, thiazine-based pigments, oxazine-based pigments, xanthene-based pigments, cyanine pigments, styryl pigments, pyrylium-based pigments, quinacridone-based pigments, indigo-based pigments, perylene-based pigments, polycyclic quinone-based pigments, bis (benzimidazole)-based pigments, indanthrone-based pigments, squarylium-based pigments, anthraquinone-based pigments, and phthalocyanine-based pigments such as copper phthalocyanine and titanylphthalocyanine.

As shown above, since the organic semiconductor layer 5 is formed from organic materials, vaporization or coating can be used to form the organic semiconductor layer 5, and this can effectively reduce the costs of the manufacturing equipment and the device.

Preferably, the source electrode 3, drain electrode 4, and the gate electrode 1 are formed from, for example, a metal selected from the group including chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn), or at least one electrically conductive polymer selected from the group including polyacetylene-based electrically conductive polymers, polyphenylene-based electrically conductive polymers such as poly(para-phenylene) and derivatives thereof and poly(phenylene vinylene) and derivatives thereof, heterocyclic electrically conductive polymers such as polypyrtrole and derivatives thereof, polythiophene and derivatives thereof, poly(ethylenedioxythiophene) and derivatives thereof, and polyfuran and derivatives thereof, and ionic electrically conductive polymers such as polyaniline and derivatives thereof.

Preferably, the insulating layer 2 is formed from, for example, at least one resin selected from the group including thermoplastic resins such as styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or a metal oxide produced via oxidation of a surface of an electrode layer formed from the metal.

As shown above, since the insulating layer 2 is formed from polymers, coating or other techniques can be used to form the layer 2. In addition, the insulating layer 2 may also be formed, for example, by surface oxidation of the electrode layer, which results in reduced costs in the manufacturing equipment and the device.

Alternatively, the insulating layer 2 may be formed from a metal oxide film produced by coating and baking a solution obtained via hydrolysis of a known metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

As described above, the insulating layer 2 is formed from metal oxide films obtained by coating or heat-drying the solution produced in hydrolysis of metal alkoxide, so the insulating layer 2 can be formed without the complicated vacuum processing, which results in reduced costs in the manufacturing equipment and the device.

Particularly, since a polyimide resin has both good electric resistance and good solvent resistance characteristics, a polyimide resin may be preferably used as the insulating layer 2 and the high resistance layer 7, and even if a material dissolved or dispersed in an organic solvent is applied on the resin, the resin is not be seriously damaged.

In the active device 20 of the present embodiment, the low resistance layer 6 that has an electrical resistance lower than that of the organic semiconductor layer 5 is formed to cover the whole channel region, so it is possible to make the channel short. In the active device 20, if the channel is made short, the distance that carriers move becomes short, and the probability for the carriers to be trapped becomes small. Therefore, a greater current can be generated, and a higher carrier mobility may be obtainable. So, according to the active device 20 of the present embodiment, it is possible to realize fast switching and large current driving.

On the other hand, if the low resistance layer 6 is formed to cover the whole channel region, as in the active device 20, the current may increase in the OFF state. In this case, the low resistance layer 6 may be made into an inter-digital shape as shown, for example, in FIG. 2B, or, although not illustrated, into a grating shape or a disk shape to adjust the width of the low resistance layer 6 in the channel length direction and suppress the magnitude of the current in the OFF state.

Switching performance of an active device is expressed by the following formula in terms of switching frequency fc, as suggested in Appl. Phys. Lett., vol. 76, No. 14, 3 Apr. (2000), 1941–1943.

$$fc=\mu Vd/2\pi L^2$$

where $\mu$ represents the carrier mobility; Vd represents the source-drain voltage, and L represents the channel length. It is reported that this formula reproduces experimental results very well.

In the active device 20 of the present embodiment, when a voltage is applied between the source electrode 3 and the drain electrode 4, carriers enter the low resistance layer 6 from the first electrode 3 via the organic semiconductor layer 5, are injected into the organic semiconductor layer 5 from the low resistance layer 6, and flow to the second electrode 4. Accordingly, it is easily possible to make the channel short. In addition, concerning the fabricating process of the active device 20 of the present embodiment, there is only one more step of forming the film of the low resistance layer 6 besides those steps for forming the thin film FET active device of the related art (refer to FIG. 27), so the fabrication is easy.

Since the active device 20 of the present embodiment is the same as the thin film FET active device of the related art (refer to FIG. 27) except for an additional low resistance layer 6, the effect of the low resistance layer 6 in the present embodiment may be realized by just setting the resistance between the source electrode 3 and the drain electrode 4 in the active device 20 sufficiently small compared with that of the resistance between the source electrode 203 and the drain electrode 204.

Figure 27:
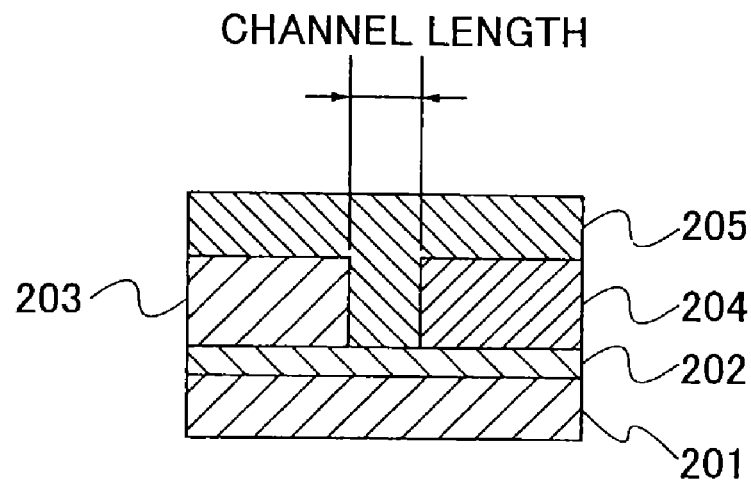
FIG. 27 is a sectional view showing an example of a thin film field effect transistor of the related art.
Figure 28:
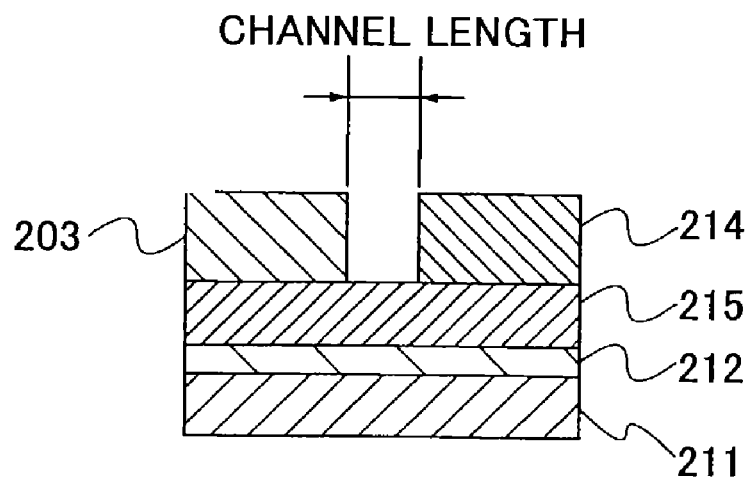
FIG. 28 is a sectional view showing another example of a thin film field effect transistor of the related art.
Figure 29A:
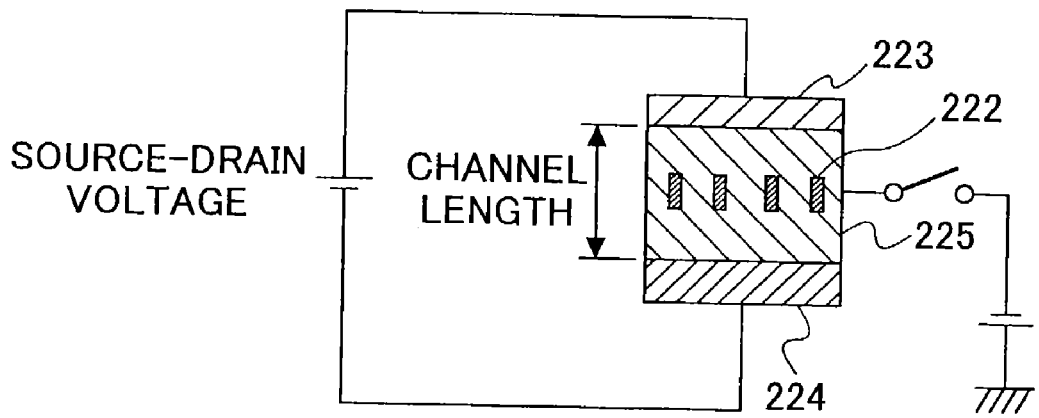
FIGS. 29A and 29B are sectional views showing static induction transistors of the related art.
Figure 29B:
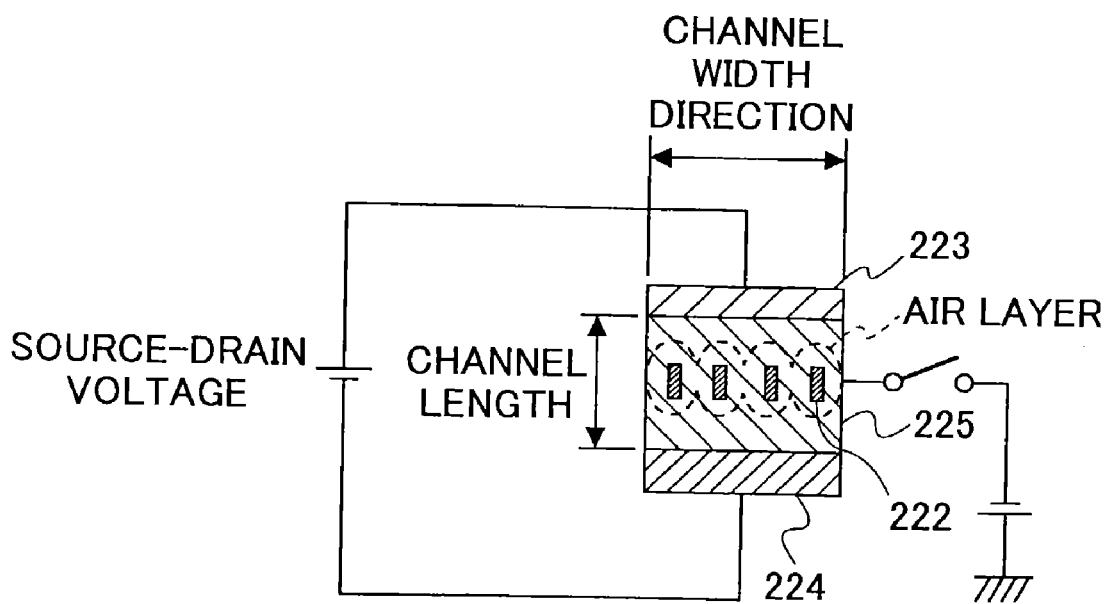

For example, the resistance between the source electrode 3 and the drain electrode 4 in the active device 20 may be set less than one-tenth of the resistance between the source electrode 203 and the drain electrode 204, if the active device 20 has the same distance between the first electrode 3 and the second electrode 4, the same channel length, and the same constituent parts but the low resistance layer 6 as the thin film FET active device of the related art shown in FIG. 27.

In the active device 20 of the present embodiment, when a gate voltage is applied to the gate electrode 1, the channel region should reach the first electrode 3, the second electrode 4, and the low resistance layer 6. It is difficult to do this with a common inorganic semiconductor. In a common inorganic semiconductor, minority carriers in the semiconductor layer are concentrated near the surface of the insulating layer, thereby forming a channel layer. For this reason, when using a common inorganic semiconductor, the source electrode 3 and the drain electrode 4 have to be formed to be smaller than the channel thickness.

With an organic semiconductor, although the mechanism of channel formation is still not yet clarified, it is known that the channel width may reach 100 nm, being thicker than the typical thickness 50 nm) of the source/drain electrode of a TFT device. Even if the channel width is 100 nm, in the active device 20 shown in FIG. 1, wherein the thickness of the source/drain electrode is formed to be 40 nm, and the semiconductor layer is formed to be 100 nm, because a TFT device having a channel length of 60 nm is obtained, and the channel is formed all over the semiconductor layer, it becomes possible to modulate the source-drain current by applying a gate voltage.

In the active device 20 of the present embodiment, both the distance from the first electrode 3 to the low resistance layer 6 and the distance from the second electrode 4 to the low resistance layer 6 are shorter than the distance between the source electrode 3 and the drain electrode 4, so, it is possible to obtain a desired current to generate the ON state.

In practical use of the active device 20, either the first electrode 3 or the second electrode 4 needs to be formed thinner than the channel thickness. In doing this, it is possible to obtain a desired current to generate the ON state by controlling the current between the source electrode 3 and the drain electrode 4.

Generally, it is preferable that the first electrode 3 and the second electrode 4 be formed as thin as possible. This is also true for a TFT having a common structure. In a common TFT, the first electrode 3 and the second electrode 4 correspond to the source and drain electrodes, respectively, and the purpose of making the source and drain electrodes thin is to increase the degree of integration of the common TFT.

In the TFT having the structure described in the present embodiment, thin source and drain electrodes result in not only a higher degree of integration but also lower current in the OFF state, and therefore it is more important to make the first electrode 3 and the second electrode 4 thin in the TFT of the present embodiment, more so than in the common TFT. For example, the thickness of the first electrode 3 and the second electrode 4 may be adjusted, respectively, so that the ratio of the currents in the ON state and OFF state becomes the maximum.

In the present embodiment, the channel thickness is defined as below.

Figure 3:
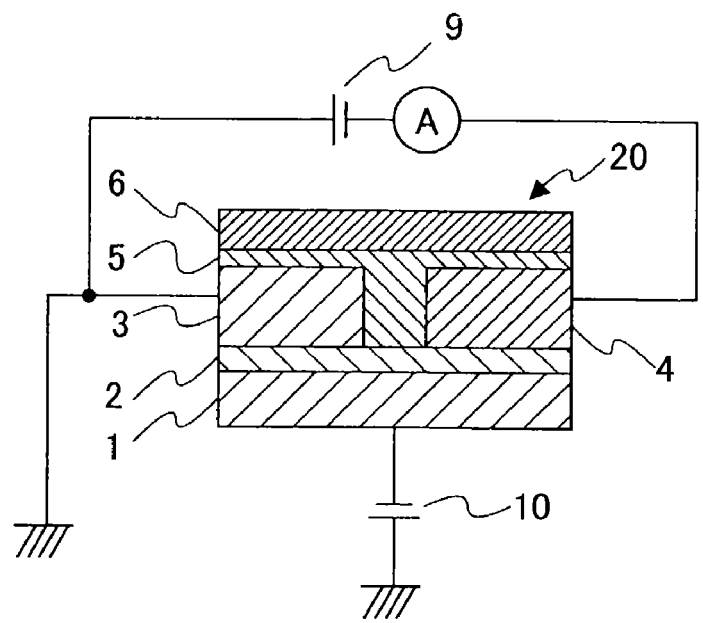
FIG. 3 is a sectional view of the active device 20 in FIG. 1 connected to power supplies.

FIG. 3 is a partial sectional view of the active device 20 connected to power supplies. Turning on the power supplies to drive the active device 20, it is possible to measure the channel thickness of the active device 20.

In FIG. 3, a voltage supplied by the power supply 10 is applied to the gate electrode 1. The numeral 9 indicates a power supply generating a current between the source electrode 3 and the drain electrode 4.

In measurement of the channel thickness, the materials and thickness of the gate insulating layer 2, the source electrode 3, drain electrode 4, as well as the material of the organic semiconductor layer 5 are set to have values as in practical use. Then, the thickness of the organic semiconductor layer 5 is changed from 10 nm to a few hundred nm, and the thickness of the organic semiconductor layer 5 making the source-drain current maximum is defined as the channel thickness.

In the active device 20 of the present embodiment, a substrate (for example, the substrate 8 in FIG. 12) is provided below the gate electrode 1 as viewed in FIG. 12. Preferably, this substrate is flexible and formed from, for example, a resin selected from the group including styrene-based polymers such as copoly(styrene/butadiene), copoly(styrene/acrylonitrile), terpoly(styrene/acrylonitrile/butadiene), copoly (styrene/maleic acid), and copoly(styrene/acrylic acid), polyethylene-based resins such as copoly(ethylene/vinyl acetate) and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates.

The active device 20 of the present embodiment may be fabricated, for example, as described below. First, the gate electrode 1 is formed on an insulating substrate (not shown), then the gate insulating film 2 is formed on the gate electrode 1, and then, the first electrode (source electrode) 3 and the second electrode (drain electrode) 4 are formed on the gate insulating layer 2. The source electrode 3 and the drain electrode 4 are arranged in the same plane and at a certain interval. Then the organic semiconductor layer 5 is formed to be disposed in the interval between the source electrode 3 and the drain electrode 4 and cover the upper surfaces of the source electrode 3 and the drain electrode 4. Further, on the organic semiconductor layer 5, the low resistance layer 6 is formed from a material having an electrical resistance lower than that of the organic semiconductor layer 5.

The Second Embodiment

Figure 4:
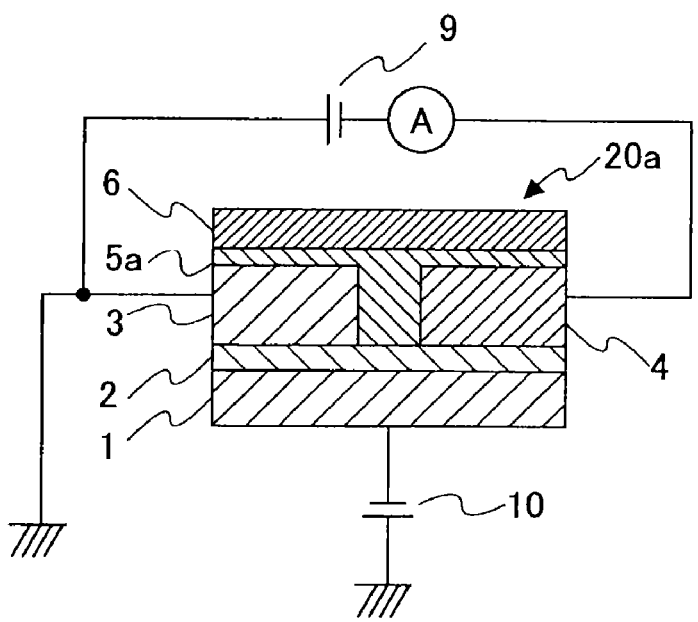
FIG. 4 is a sectional view showing a configuration of an active device 20a according to a second embodiment of the present invention.

FIG. 4 shows a sectional view of an active device 20a according to a second embodiment of the present invention.

As shown in FIG. 4, the active device 20a includes a gate electrode 1, an insulating layer 2 (gate insulating film) on the gate electrode 1, a first electrode 3 (source electrode) and a second electrode 4 (drain electrode) on the insulating layer 2 arranged at an interval in the same plane, an organic semiconductor layer 5a disposed in the interval between the source electrode 3 and the drain electrode 4 and covering the upper surfaces of the source electrode 3 and the drain electrode 4, and a low resistance layer 6 having an electrical resistance lower than that of the organic semiconductor layer 5 and formed above the organic semiconductor layer 5.

Preferably, the organic semiconductor layer 5a is formed from the same organic semiconductor materials as described in the first embodiment, but the organic semiconductor layer 5a includes dielectric materials.

Preferably, the dielectric materials may be from styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, a metal oxide film produced by baking a solution obtained via hydrolysis of a metal alkoxide represented by one of the general formulas $M(OR)_n$ and $MR(OR')_{n-1}$, in which each of R and R' is an organic group such as an alkyl group and a phenyl group, M is a metal in one of IVA through VIIA groups, VIII group, and IB through VIB groups of the periodic table, and n is an ionic valence of the metal M, an oxide of one of Al, Ta, and W, Si, and a nitride of Si.

Figure 5:
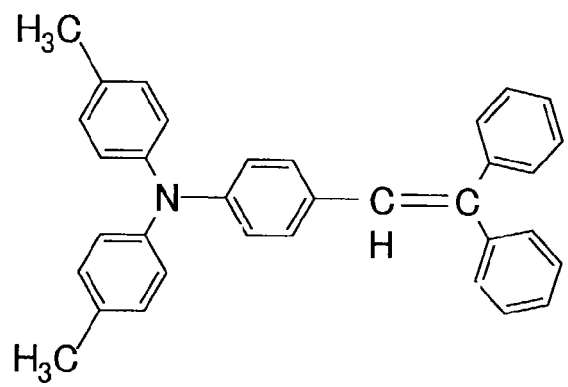
FIG. 5 shows a chemical formula representing an organic semiconductor material used in the second embodiment of the present invention.

FIG. 5 shows a chemical formula representing an organic semiconductor material used in the second embodiment of the present invention.

For example, the organic semiconductor layer 5a includes the organic semiconductor material represented by the chemical formula shown in FIG. 5 and a polycarbonate dielectric material. In the organic semiconductor layer 5a, for example, the organic semiconductor material amounts to 90% by weight, and the polycarbonate amounts to 10% by weight, and the polycarbonate is dispersed in the organic semiconductor material.

The low resistance layer 6, source electrode 3, drain electrode 4, the gate electrode 1, and the insulating layer 2 are formed from the materials as described in the first embodiment.

In the present invention, the "dielectric material" means a material having a dielectric constant greater than 1.5 determined according to the ASTM-D150 (American Society for Testing and Materials) standard (the frequency is 1 kHz). Therefore, even if the organic semiconductor material of the organic semiconductor layer 5a does not explicitly include dielectric materials, as long as the dielectric constant of the organic semiconductor material is greater than 1.5, such a organic semiconductor layer is within the scope of the present invention.

The dielectric materials can be dispersed in the organic semiconductor material, for example, by molecule dispersion, or be dispersed after making the dielectric materials into fine particles.

In the active device 20a, the low resistance layer 6 having an electrical resistance lower than that of the organic semiconductor layer 5a is formed to cover the whole channel region, so it is possible to make the channel short, and therefore, a greater current and higher carrier mobility are obtainable. So, according to the active device 20a, it is possible to realize fast switching and large current driving.

Since the organic semiconductor layer 5a is formed from organic materials, vaporization or coating can be used to form the organic semiconductor layer 5, and this can effectively reduce the costs of the manufacturing equipment and the device.

Further, since the organic semiconductor layer 5a includes dielectric materials, although the mechanism concerned has not been clarified, when a gate voltage is applied to the active device 20a, the channel length thereof (the thickness of the channel layer) can be made greater than the typical thickness of the source electrode 3 and drain electrode 4 of the active device 20a (a TFT device), and as a result, when the low resistance layer 6 is formed above the source electrode 3, the drain electrode 4, and the organic semiconductor layer 5a, the channel is in contact with the low resistance layer 6, enabling driving by a large current.

In addition, by including dielectric materials in the organic semiconductor layer 5a, the resistance of the organic semiconductor layer 5a increases, and resultantly, it becomes easy to control the magnitude of the current in the OFF state. For example, the amount of the dielectric materials may be appropriately determined according to a target value of the current in the OFF state.

The Third Embodiment

Figure 6:
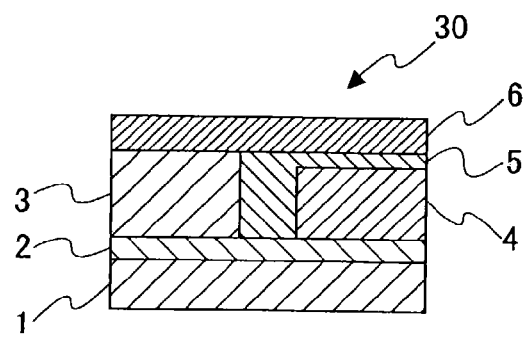
FIG. 6 is a sectional view of a configuration of an active device 30 according to a third embodiment of the present invention.

FIG. 6 shows a sectional view of a configuration of an active device 30 according to the third embodiment of the present invention.

As shown in FIG. 6, the active device 30 includes a gate electrode 1, a gate insulating film 2 on the gate electrode 1, a source electrode 3 and a drain electrode 4 on the gate insulating film 2 arranged at an interval in the same plane, an organic semiconductor layer 5 disposed in the interval between the source electrode 3 and the drain electrode 4 and covering the upper surface of the drain electrode 4, and a low resistance layer 6 having an electrical resistance lower than that of the organic semiconductor layer 5 and formed on the source electrode 3 and the organic semiconductor layer 5.

As shown in FIG. 6, in the active device 30 of the present embodiment, the source electrode 3 is in contact with the low resistance layer 6. Due to this, it is possible to make the channel length of the active device 30 short.

It will be appreciated that it is also possible to make the drain electrode 4 in contact with the low resistance layer 6. In this case, the organic semiconductor layer 5 needs to be formed to cover the source electrode 3 instead of the drain electrode 4. This configuration has the same effects as that of the first embodiment.

The active device 30 of the present embodiment may be fabricated, for example, as described below. First, the gate electrode 1 is formed on an insulating substrate (not shown), then the gate insulating film 2 is formed on the gate electrode 1, and then, the source electrode 3 and the drain electrode 4 are formed on the gate insulating film 2. The source electrode 3 and the drain electrode 4 are arranged in the same plane and at a certain interval. Then the organic semiconductor layer 5 is formed while the source electrode 3 is masked. The organic semiconductor layer 5 is disposed in the interval between the source electrode 3 and the drain electrode 4, and covers the upper surface of the drain electrode 4. Then the mask is removed and on the organic semiconductor layer 5 and the source electrode 3, the low resistance layer 6 is formed from a material having an electrical resistance lower than that of the organic semiconductor layer 5.

The active device 30 can also be fabricated, for example, by forming the source electrode 3 higher than the thickness of the organic semiconductor layer 5, and then forming the organic semiconductor layer 5 on the drain electrode 4.

The Fourth Embodiment

Figure 7:
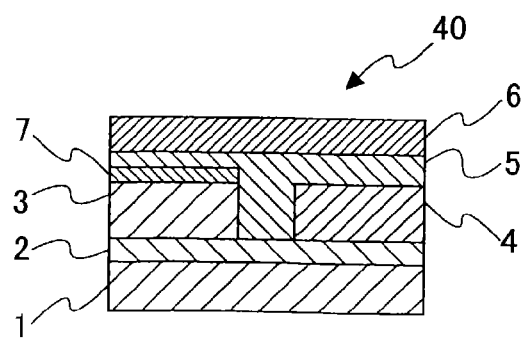
FIG. 7 is a sectional view of a configuration of an active device 40 according to a fourth embodiment of the present invention.

FIG. 7 shows a sectional view of an active device 40 according to the fourth embodiment of the present invention.

As shown in FIG. 7, the active device 40 includes a gate electrode 1, a gate insulating film 2 on the gate electrode 1, a source electrode 3 and a drain electrode 4 on the gate insulating film 2, an organic semiconductor layer 5 disposed in the interval between the source electrode 3 and the drain electrode 4 and covering the source electrode 3 and the drain electrode 4, and a low resistance layer 6 having an electrical resistance lower than that of the organic semiconductor layer 5 and formed on the organic semiconductor layer 5. The active device 40 is different from the active device 20 in the first embodiment in the respect that there is a high resistance layer 7 formed between the source electrode 3 and the organic semiconductor layer 5. The resistance of the organic semiconductor layer 5 is determined so that carriers in the organic semiconductor layer 5 are able to tunnel through the high resistance layer 7 when a sufficiently high gate voltage is applied to the gate electrode 1.

Figure 8:
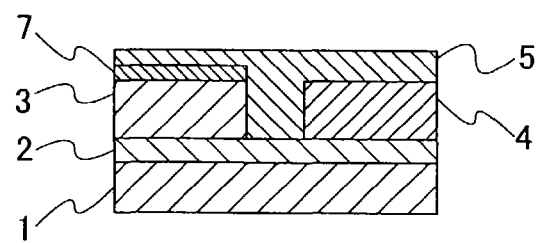
FIG. 8 is a sectional view for explaining the fabrication steps of the active device in FIG. 7.

FIG. 8 is a sectional view for explaining the fabrication steps of the active device 40 in FIG. 7.

When fabricating the active device 40 of the present embodiment, it is desirable to measure the electrical resistance between the source electrode 3 and the drain electrode 4 before the low resistance layer 6 is formed; then the high resistance layer 7 and the low resistance layer 6 are formed so that the electrical resistance between the source electrode 3 and the low resistance layer 6 is equal to or lower than that between the source electrode 3 and the drain electrode 4.

Figure 9:
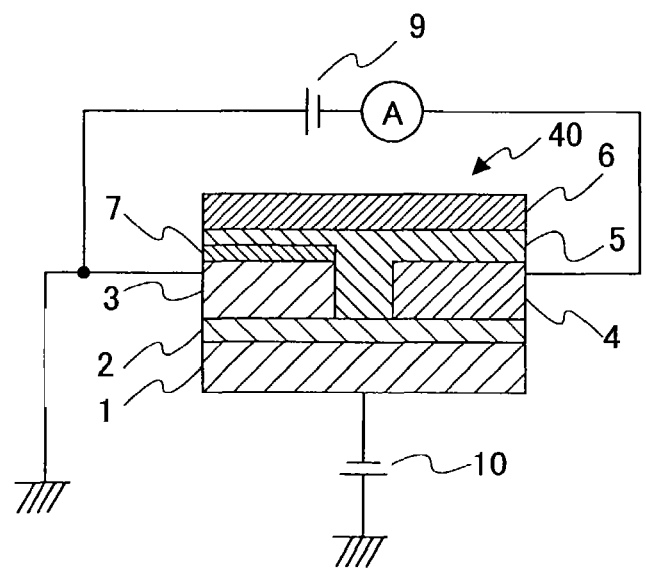
FIG. 9 is a partial sectional view of the active 40 connected with power supplies.

FIG. 9 is a partial sectional view of the active device 40 connected to power supplies.

In the device shown in FIG. 9, a voltage output from a power supply 10 is applied to the gate electrode 1, and thereby the resistance of the organic semiconductor layer 5 decreases. Accordingly, if there is a sufficiently high potential drop across the gate insulating film 2, a tunneling current is generated in the gate insulating film 2, and a desired current is obtained to generate the ON state. When the power supply 10 is not in operation, the gate insulating layer 2 blocks the movement of carriers, making it possible to reduce the current in the OFF state. In this way, with the active device 40 of the present embodiment, it is possible to obtain a high current ratio in ON/OFF states. In FIG. 9, the numeral 9 indicates a power supply generating a current between the source electrode 3 and the drain electrode 4.

Preferably, the high resistance layer 7 is formed from, for example, at least one resin selected from the group including thermoplastic resins such as styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or a metal oxide produced via oxidation of a surface of an electrode layer formed from the metal.

Since the high resistance layer 7 is formed from polymers, coating or other techniques can be used to form the layer 7. In addition, the high resistance layer 7 can be formed, for example, by surface oxidation of the electrode layer, which results in reduced costs of the manufacturing equipment and the device.

Preferably, the high resistance layer 7 is formed from, for example, a metal oxide film produced by coating and baking a solution obtained via hydrolysis of a known metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

Since the high resistance layer 7 is formed from metal oxide films obtained by coating or heat-drying the solution produced in hydrolysis of metal alkoxide, the high resistance layer 7 can be formed without the complicated vacuum processing, and therefore, costs of the manufacturing equipment and the device can be reduced.

Particularly, since a polyimide resin has both good electric resistance and good solvent resistance, a polyimide resin may be preferably used as the insulating layer 2 and the high resistance layer 7, and even if a material dissolved or dispersed in an organic solvent is applied on the resin, the resin is not be seriously damaged.

Figure 30:
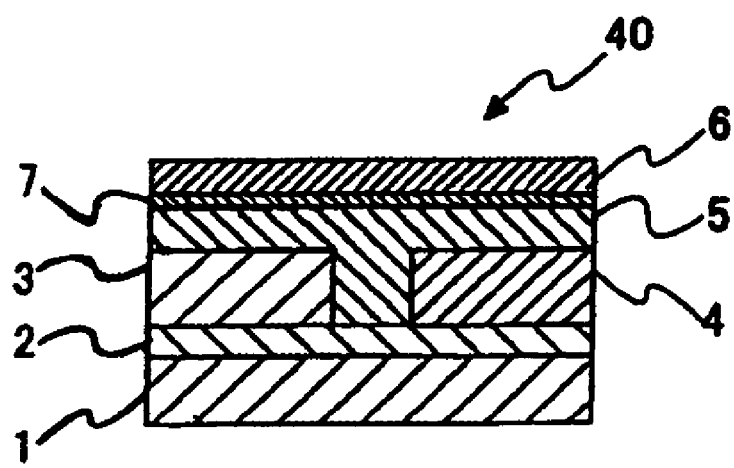
FIG. 30 is another sectional view of a configuration of an active device 40 according to a fourth embodiment of the present invention.

It is explained in the above description that the high resistance layer 7 is disposed between the source electrode 3 and the organic semiconductor layer 5 as illustrated. But the present invention is not limited to this. The high resistance layer 7 may also be disposed between the source electrode 3 and the organic semiconductor layer 5, and/or between the drain electrode 4 and the organic semiconductor layer 5, and/or between the low resistance layer 6 and the organic semiconductor layer 5 as shown in FIG. 30. The above configurations have the same effects as that described above.

The Fifth Embodiment

Figure 10:
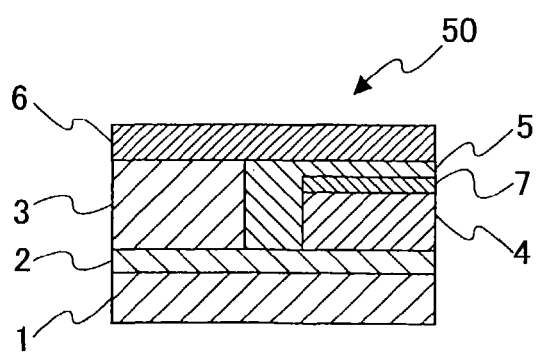
FIG. 10 is a sectional view of a configuration of an active device 50 according to a fifth embodiment of the present invention.

FIG. 10 shows a sectional view of an active device 50 according to a fifth embodiment of the present invention.

As shown in FIG. 10, the active device 50 includes a gate electrode 1, a gate insulating film 2 on the gate electrode 1, a source electrode 3 and a drain electrode 4 on the gate insulating film 2, an organic semiconductor layer 5 disposed in the interval between the source electrode 3 and the drain electrode 4 and covering the drain electrode 4, a high resistance layer 7 disposed between the drain electrode 4 and the organic semiconductor layer 5, and a low resistance layer 6 having an electrical resistance lower than that of the organic semiconductor layer 5 and formed on the organic semiconductor layer 5 and the source electrode 3.

The active device 50 of the present embodiment is different from the active device 40 of the fourth embodiment in the respect that the source electrode 3 is in contact with the low resistance layer 6 in the active device 50, and the interface between the source electrode 3 and the low resistance layer 6 is of rectification capability.

With the above configuration, it is possible to make the channel length short, and to obtain a high ON/OFF ratio.

The rectification capability is explained below while considering the case of contact between a metal and a p-type semiconductor (hole transporting semiconductor).

Figure 11A:
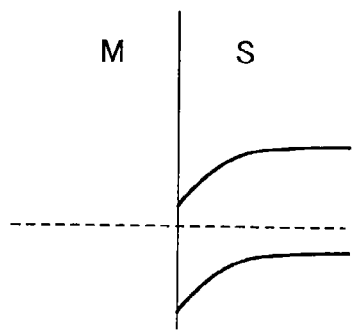
FIGS. 11A through 11C are graphs showing rectification performance of the active device according to the fifth embodiment of the present invention.
Figure 11B:
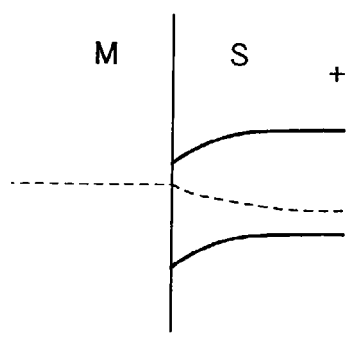
Figure 11C:
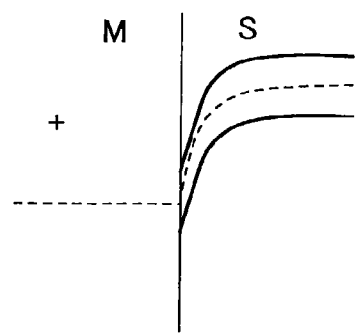

FIGS. 11A through 11C are graphs showing rectification performance of the active device 50 according to the fifth embodiment of the present invention.

In FIGS. 11A through 11C, the symbol "M" indicates one of the source electrode 3, the drain electrode 4, and the low resistance layer 6; the symbol "S" indicates the organic semiconductor layer 5.

When the work function of M is higher than that of S, due to the contact of M and S, the band bends downward as shown in FIG. 11A.

Under this condition, if a negative voltage is applied to M, and a positive voltage is applied to S, as shown in FIG. 11B, the potential of M becomes lower relative to that of S, and therefore, the potential barrier becomes lower, and holes move toward M easily.

To the contrary, as shown in FIG. 11C, if a positive voltage is applied to M, and a negative voltage is applied to S, the potential of M becomes higher relative to that of S, and therefore, the potential barrier becomes higher, and it becomes difficult for holes to move to M.

In the present invention, the electrodes are formed from the materials described in the first embodiment. Material selection of the electrodes may be made from the view of the work function of a material. For example, if the semiconductor material (here, the organic semiconductor layer 5) is a hole transporting material, the electrodes may be made from metals having low work functions, such as Mg, Al, Cr, Ag, and so on; and if the semiconductor material is an electron transporting material, the electrodes may be made from metals having high work functions, such as Au, Pt and so on.

When configuring a device similar to that in FIG. 9 but including the active device 20, if the organic semiconductor layer 5 is formed from a hole transporting material, and the source electrode 3 and the drain electrode 4 are formed from a material having a work function lower than that of the organic semiconductor layer 5, rectification interfaces can be formed between one of the electrodes and the organic semiconductor layer 5. Since the potential barrier becomes higher at the interface between the source electrode 3 and the organic semiconductor layer 5, it is difficult for carriers to move, and therefore the current in the OFF state can be suppressed.

The Sixth Embodiment

Figure 12:
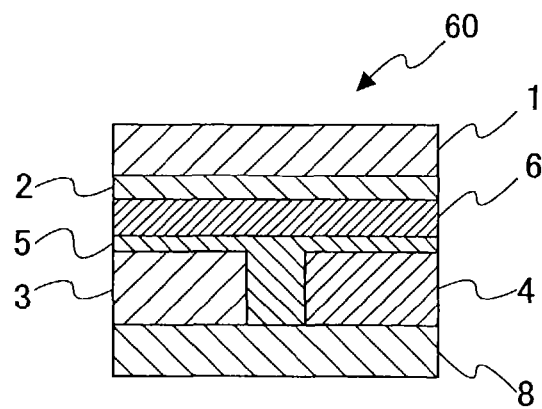
FIG. 12 is a sectional view of an active device according to a sixth embodiment of the present invention.

FIG. 12 shows a sectional view of an active device 60 according to the sixth embodiment of the present invention.

As shown in FIG. 12, the active device 60 includes a substrate 8, a source electrode 3 and a drain electrode 4 at an interval in the same plane on the substrate 8, an organic semiconductor layer 5 disposed in the interval between the source electrode 3 and the drain electrode 4 and covering the upper surfaces of the source electrode 3 and the drain electrode 4, a low resistance layer 6 having an electrical resistance lower than that of the organic semiconductor layer 5 and formed above the organic semiconductor layer 5, a gate insulating film 2 on the low resistance layer 6, and a gate electrode 1 on the gate insulating film 2.

Figure 13:
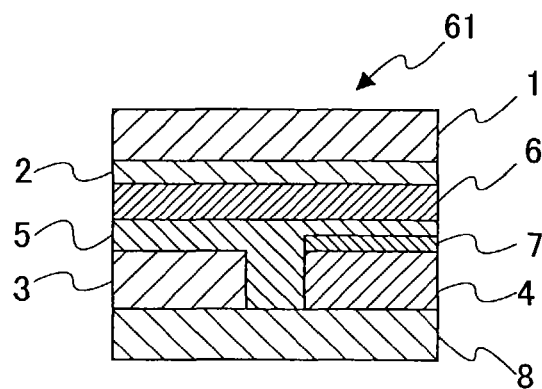
FIG. 13 is a sectional view of another configuration of the active device of the sixth embodiment of the present invention.

FIG. 13 shows a configuration of an active device 61 according to the sixth embodiment of the present invention.

As shown in FIG. 13, in the active device 61, a high resistance layer 7 as described in previous embodiments may be disposed, for example, between the drain electrode 4 and the organic semiconductor layer 5, as illustrated, to allow carriers in the organic semiconductor layer 5 to tunnel through the high resistance layer 7 when a sufficiently high gate voltage is applied to the gate electrode 1.

As mentioned above, the high resistance layer 7 may be formed between the source electrode 3 and the organic semiconductor layer 5, and/or between the drain electrode 4 and the organic semiconductor layer 5, and/or between the low resistance layer 6 and the organic semiconductor layer 5.

In the active devices 60 and 61 of the present embodiment, since the low resistance layer 6 having an electrical resistance lower than that of the organic semiconductor layer 5 is disposed in the same manner as the active device 20 of the first embodiment, it becomes easy to make the channel short. In the active devices 60 and 61, if the channel is made short, the distance that carriers move becomes short, and the probability for the carriers to be trapped becomes small. Therefore a greater current can be generated, and higher carrier mobility is obtainable. So, according to the active devices 60 and 61 of the present embodiment, it is possible to realize fast switching and large current driving.

Further, because the high resistance layer 7 is disposed between the drain electrode 4 and the organic semiconductor layer 5, as shown in FIG. 13, or between the source electrode 3 and the organic semiconductor layer 5, or between the low resistance layer 6 and the organic semiconductor layer 5, carriers in the organic semiconductor layer 5 are allowed to tunnel through the high resistance layer 7 when a sufficiently high gate voltage is applied to the gate electrode 1.

In a manner the same as the active device 40 of the fourth embodiment, in the active devices 60 and 61, when a gate voltage is applied to the gate electrode 1, the resistance of the organic semiconductor layer 5 decreases. Accordingly, there is a sufficiently large potential drop across the gate insulating film 2, a tunneling current is generated in the gate insulating film 2, and a desired current is obtained to generate the ON state. When the gate voltage is not applied, the gate insulating layer 2 blocks the movement of carriers, making it possible to reduce the current in the OFF state. In this way, with the active device 61 of the present embodiment, it is possible to obtain a high current ratio in ON/OFF states.

The Seventh Embodiment

Figure 14:
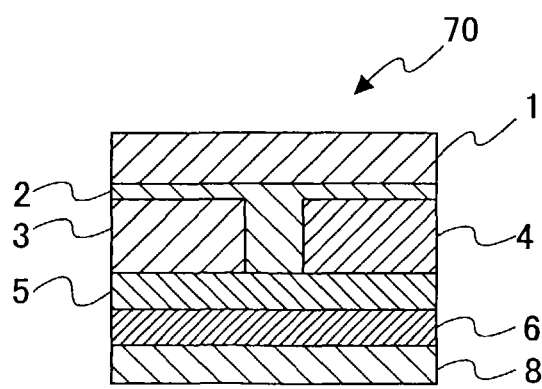
FIG. 14 is a sectional view of an active device according to a seventh embodiment of the present invention.

FIG. 14 shows a sectional view of an active device 70 according to the seventh embodiment of the present invention.

In FIG. 14, the active device 70 includes a substrate 8, a low resistance layer 6 on the substrate 8, an organic semiconductor layer 5 on the low resistance layer 6, a source electrode 3 and a drain electrode at an interval in the same plane on the organic semiconductor layer 5, a gate insulating film 2 disposed in the interval between the source electrode 3 and the drain electrode 4 and covering the upper surfaces of the source electrode 3 and the drain electrode 4, and a gate electrode 1 on the gate insulating film 2. The electrical resistance of the low resistance layer 6 is lower than that of the organic semiconductor layer 5.

Figure 15:
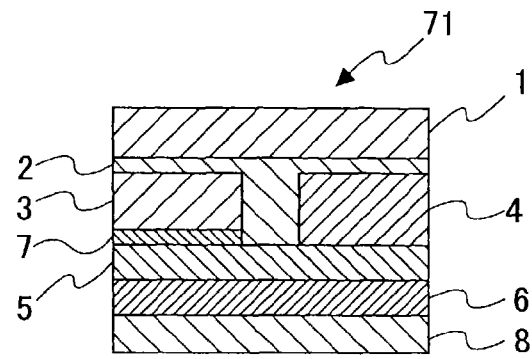
FIG. 15 is a sectional view of another configuration of the active device according to the seventh embodiment of the present invention.

FIG. 15 shows a configuration of an active device 71 according to the seventh embodiment of the present invention.

As shown in FIG. 15, in the active device 71, a high resistance layer 7 as described in previous embodiments may be formed, for example, between the source electrode 3 and the organic semiconductor layer 5 to allow carriers in the organic semiconductor layer 5 to tunnel through the high resistance layer 7 when a sufficiently high gate voltage is applied to the gate electrode 1. As mentioned above, the high resistance layer 7 may also be formed between the drain electrode 4 and the organic semiconductor layer 5, and/or between the low resistance layer 6 and the organic semiconductor layer 5.

In the active device 71 of the present embodiment, since the low resistance layer 6 having an electrical resistance lower than that of the organic semiconductor layer 5 is formed in a manner the same as the active device 20 of the first embodiment, it becomes easy to make the channel short. In the active device 71, if the channel is made short, the distance that carriers move becomes short, and the probability for the carriers to be trapped becomes small. Therefore a greater current can be generated, and higher carrier mobility is obtainable. So, according to the active device 71 of the present embodiment, it is possible to realize fast switching and large current driving.

Further, because the high resistance layer 7 is disposed between the source electrode 3 and the organic semiconductor layer 5, as shown in FIG. 15, or between the drain electrode 4 and the organic semiconductor layer 5, or between the low resistance layer 6 and the organic semiconductor layer 5, carriers in the organic semiconductor layer 5 are allowed to tunnel through the high resistance layer 7 when a sufficiently high gate voltage is applied to the gate electrode 1.

In a manner the same as the active device 40 of the fourth embodiment, in the active devices 70 and 71, when a gate voltage is applied to the gate electrode 1, the resistance of the organic semiconductor layer 5 decreases. Accordingly, there is a sufficiently large potential drop across the gate insulating film 2, a tunneling current is generated in the gate insulating film 2, and a desired current is obtained to generate the ON state. When the gate voltage is not applied, the gate insulating layer 2 blocks the movement of carriers, making it possible to reduce the current in the OFF state. In this way, with the active devices 70 and 71 of the present embodiment, it is possible to obtain a high current ratio in ON/OFF states.

The Eighth Embodiment

Figure 16:
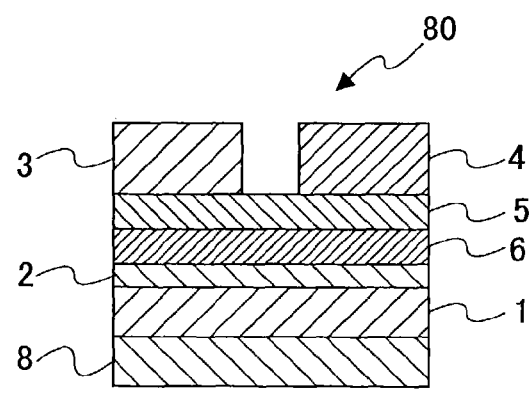
FIG. 16 is a sectional view of an active device according to an eighth embodiment of the present invention.

FIG. 16 shows a sectional view of an active device 80 according to the eighth embodiment of the present invention.

In FIG. 16, the active device 80 includes a substrate 8, a gate electrode 1 on the substrate 8, a gate insulating film 2 on the gate electrode 1, a low resistance layer 6 on the gate insulating film 2, an organic semiconductor layer 5 on the low resistance layer 6, and a source electrode 3 and a drain electrode 4 at an interval in the same plane on the organic semiconductor layer 5. The electrical resistance of the low resistance layer 6 is lower than that of the organic semiconductor layer 5.

Figure 17:
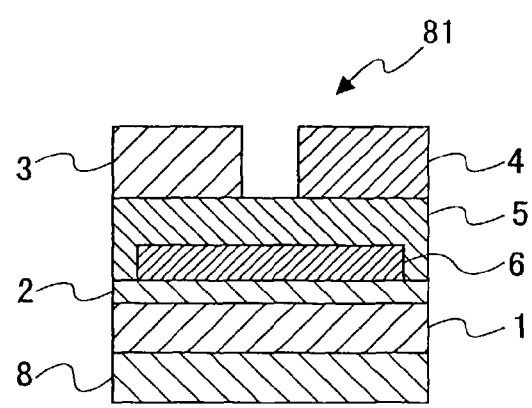
FIG. 17 is a sectional view of another configuration of the active device according to the eighth embodiment of the present invention.

FIG. 17 shows a configuration of an active device 81 according to the eighth embodiment of the present invention.

As shown in FIG. 17, the active device 81 may also have a configuration in which the two opposite ends of the low resistance layer 6 are covered by the organic semiconductor layer 5.

Figure 18:
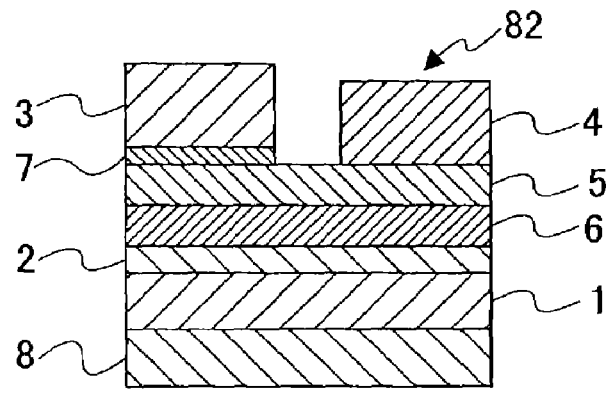
FIG. 18 is a sectional view of another configuration of the active device according to the eighth embodiment of the present invention.

FIG. 18 shows a configuration of an active device 82 of the eighth embodiment of the present invention.

As shown in FIG. 18, in the active device 82, a high resistance layer 7 as described in previous embodiments may be formed, for example, between the source electrode 3 and the organic semiconductor layer 5 to allow carriers in the organic semiconductor layer 5 to tunnel through the high resistance layer 7 when a sufficiently high gate voltage is applied to the gate electrode 1. As mentioned above, the high resistance layer 7 may also be formed between the drain electrode 4 and the organic semiconductor layer 5, and/or between the low resistance layer 6 and the organic semiconductor layer 5.

According to the active devices 80, 81, and 82 of the eighth embodiment, the gate electrode 1, the gate insulating film 2, the low resistance layer 6, the organic semiconductor layer 5, and the source electrode 3 and the drain electrode 4 are formed sequentially, so by controlling the current between the source electrode 3 and the drain electrode 4, it is possible to obtain a desired current to generating the ON state. In addition, since the channel region is formed on the surface of the low resistance layer 6, the active devices 80 through 82 are not subjected to constraint in channel thickness as mentioned above. So the active devices 80 through 82 may also be realized with an inorganic semiconductor material.

Further, when the organic semiconductor layer 5 has ohmic contact with the source electrode 3, or the drain electrode 4, or the low resistance layer 6, the potential barrier at any of these surfaces is lowered, making holes move easily and thus generating large current.

In order to obtain ohmic contact, when using a hole transporting organic semiconductor to form the organic semiconductor layer 5, it is desirable to make the work function of the organic semiconductor layer 5 lower than the source electrode 3, the drain electrode 4, and the low resistance layer 6; on the other hand, when using an electron transporting organic semiconductor for the organic semiconductor layer 5, it is desirable to make the work function of the organic semiconductor layer 5 higher than the source electrode 3, the drain electrode 4, and the low resistance layer 6. This conclusion is also true to active devices in other embodiments of the present invention.

The Ninth Embodiment

Figure 19:
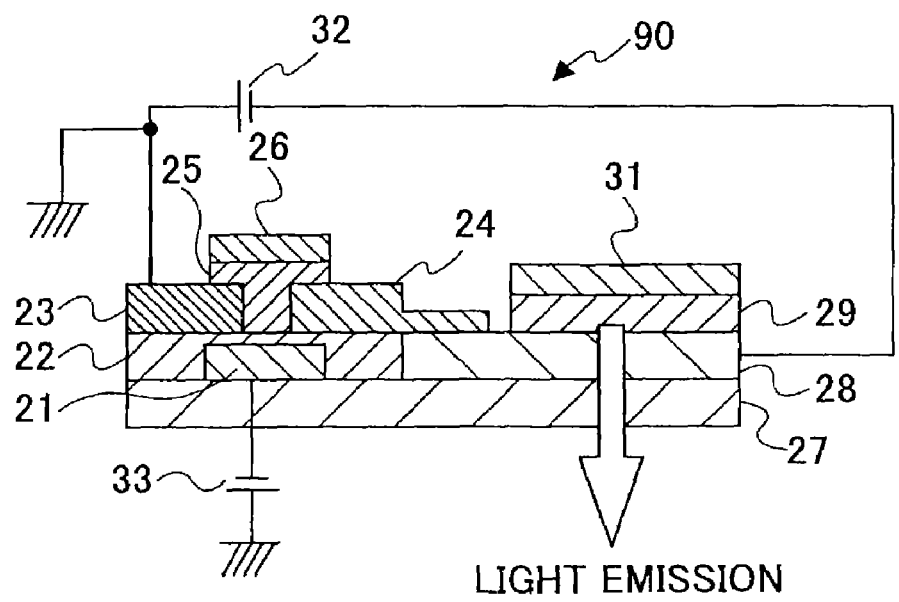
FIG. 19 is a partial sectional view of an EL display device according to a ninth embodiment of the present invention.

FIG. 19 is a partial sectional view of an EL (electroluminescent) display device 90 according to the ninth embodiment of the present invention.

As shown in FIG. 19, the EL display device 90 of the present embodiment includes a common flexible transparent substrate 27, and a pair of active devices and a light emission element arranged in a matrix manner on the substrate 27.

In the EL display device 90 of the present embodiment, each active device includes a gate electrode 21 on the substrate 27, a gate insulating film 22 covering ends and the upper surface of the gate electrode 21, a source electrode 23 and a drain electrode 24 on the gate insulating film 22 arranged at a certain interval in the same plane, an organic semiconductor layer 25 disposed in the interval between the source electrode 23 and the drain electrode 24, and a low resistance layer 26 having an electrical resistance lower than that of the organic semiconductor layer 25 and formed above the organic semiconductor layer 25.

Each light emission element includes a transparent electrode 28 on the substrate 27, an electroluminescent layer 29 on the transparent electrode 28, and a cathode 31 on the electroluminescent layer 29.

In addition, the source electrode 23 is electrically connected with the transparent electrode 28 through a power supply 32.

With the above configuration, it is possible to provide a display device at low cost but with good visibility and low power consumption.

The transparent electrode 28, for example, is formed from ITO (Indium Tin Oxide). Generally, the cathode 31 is formed from a material of a small work function, for example, Li, LiF, Ba, Mg, and so on, so as not to hinder movement of carriers. It is preferable that the value of the work function be less than 3.0 eV. Because these materials are unstable in air, it is preferable to form a stabilizing film on the surfaces of these materials. The stabilizing film is made from materials stable in the air, for example, Ag, or Al.

The electroluminescent layer 29, for example, is formed from an organic semiconductor material selected from the group including $Alq_3$ and derivatives thereof, fluorenone-based compounds and derivatives thereof, quinone-based compounds and derivatives thereof, indenone-based compounds and derivatives thereof, hydrazone-based compounds and derivatives thereof, stilbene and derivatives thereof, pyrazoline and derivatives thereof, phenylamine compounds and derivatives thereof, pyrene-based compounds and derivatives thereof, and vinyl group-containing compounds and derivatives thereof, such as N-vinylcarbazole and polyvinylanthracene.

Alternatively, the electroluminescent layer 29 is formed from an inorganic semiconductor material that contains an element in one of IVA through VIIA groups, VIII group, and IB through VIB groups of the periodic table, for example, a compound containing strontium, gallium, and sulfur in which cerium is doped, represented by $SrGa_2S_4$:Ce.

The 10th Embodiment

This embodiment relates to a liquid crystal display device including active devices as described in the previous embodiments. With such a liquid crystal display device, it is possible to provide a display device at low cost but with good visibility and low power consumption.

Figure 20:
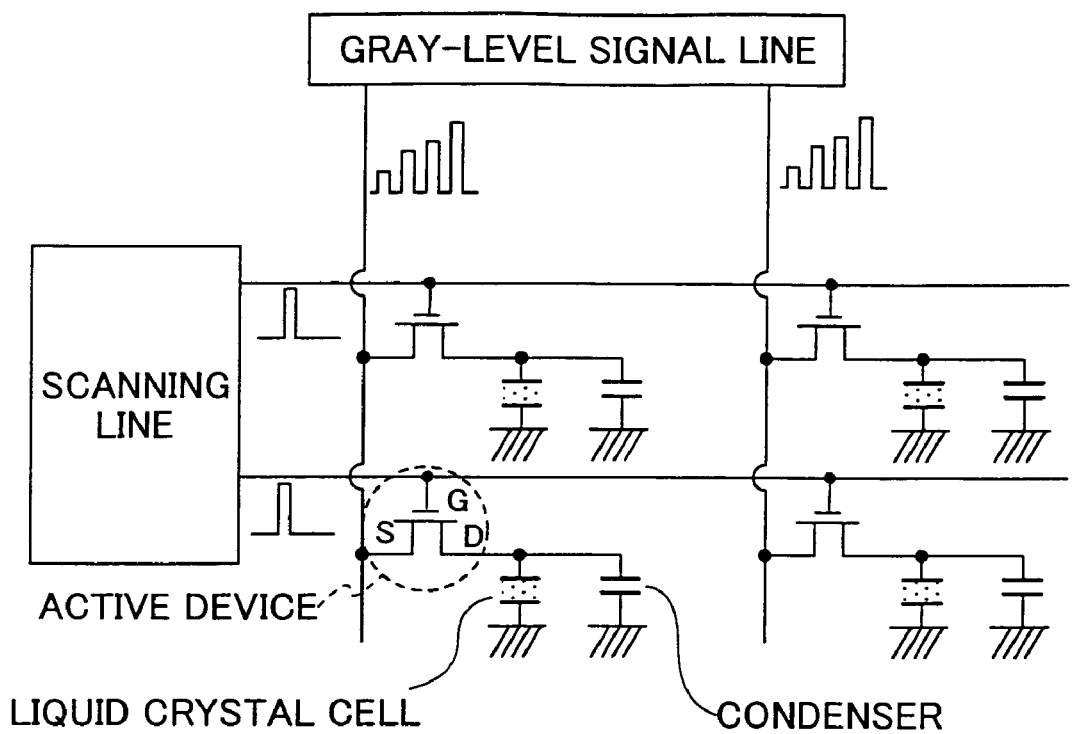
FIG. 20 is a circuit diagram of a liquid crystal display device according to a 10th embodiment of the present invention.

FIG. 20 shows an example of a circuit diagram of the liquid crystal display device according to the 10th embodiment of the present invention.

As shown in FIG. 20, according to the gray-level data of every pixel, gate voltages from the gray-level signal line are applied to gate electrodes of active device. From the scanning line, a voltage signal having ON levels and OFF levels alternatively and subsequently is supplied and is applied to subsequent lines. After scanning of one screen is finished, scanning of the next screen is started. To support motion picture display, preferably, the scanning frequency is greater than 50 Hz. The condenser shown in FIG. 20 serves the function of charging the liquid crystal cell during the transition from one screen to another screen so as to maintain the gray-level voltage in this period.

The 11th Embodiment

This embodiment relates to a calculating device including active devices as described in the previous embodiments into a NOT circuit, or a NAND circuit, or a NOR circuit.

Figure 21A:
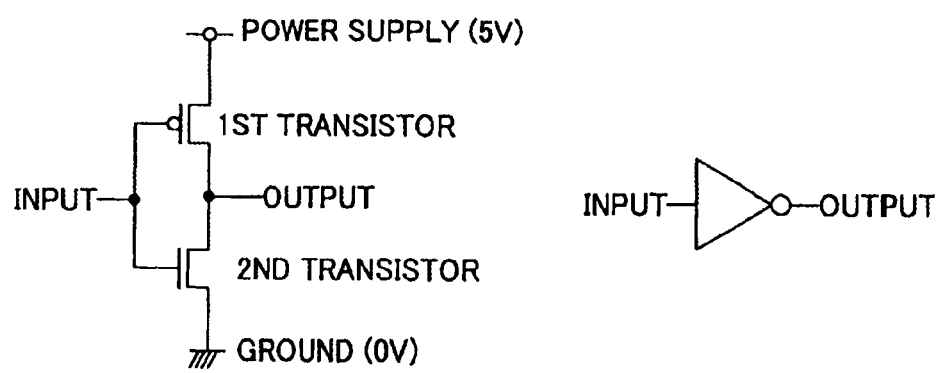
FIGS. 21A through 21C are logic circuits of a calculating device according to an 11th embodiment of the present invention, where
Figure 21B:
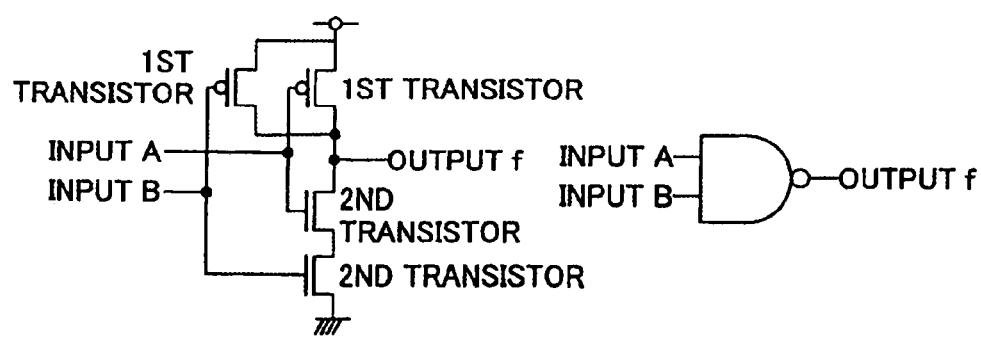
Figure 21C:
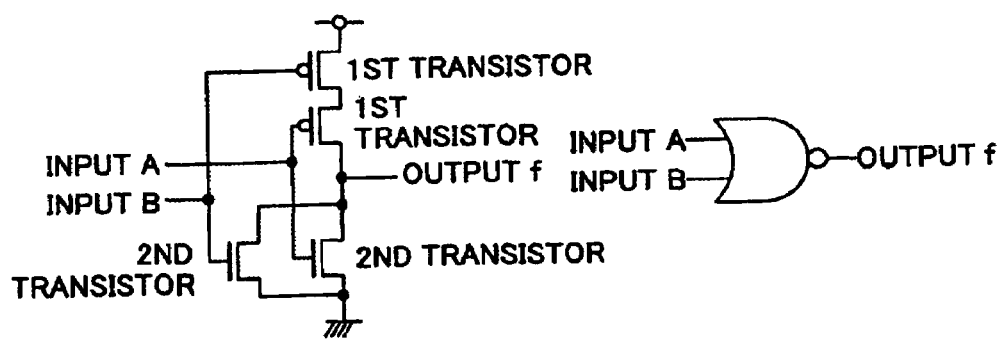

FIGS. 21A through 21C are logic circuits of the calculating device according to the 11th embodiment of the present invention, where FIG. 21A shows a NOT circuit (inverter circuit), FIG. 21B shows a NAND circuit, and FIG. 21C shows a NOR circuit.

As shown in FIGS. 21A through 21C, a first MOS transistor and a second MOS transistor are included in the NOT circuit, the NAND circuit, and the NOR circuit, respectively. The first MOS transistor functions as an active device having an organic semiconductor layer formed from a hole transporting semiconductor material. The second MOS transistor functions as another active device having an organic semiconductor layer formed from an electron transporting semiconductor material.

For example, in the NOT circuit, when the input voltage is +5 V, the second MOS transistor is ON, the first MOS transistor is OFF, and the output voltage is 0. Or, when the input voltage is 0V, the second MOS transistor is OFF; since the voltage of the poser supply is +5 V, the potential difference between the source and drain of the first MOS transistor is 5 V, so the output voltage is +5 V.

The NAND circuit and the NOR circuit operate in the similar way as the NOT circuit.

Therefore, according to the present embodiment, the calculating device of the present embodiment includes active devices of the previous embodiments into a NOT circuit, a NAND circuit, and a NOR circuit, and further the NOT circuit inverts the input voltage, the NAND circuit inverts the logic AND, and the NOR circuit inverts the logic OR, so it is possible to provide a calculating device at low cost able to perform calculation using the input signals and output the calculation results.

EXAMPLE 1

Figure 22:
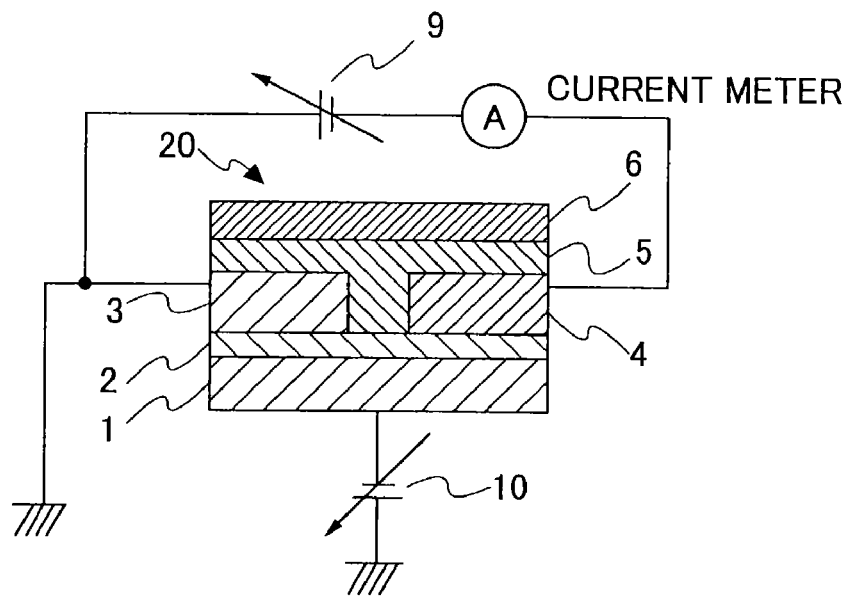
FIG. 22 is a partial sectional view of a first example of the active device of the present invention.

FIG. 22 is a partial sectional view of a first example of the active device of the present invention. The active device in FIG. 22 is the same as that shown in FIG. 1 (active device 20).

The active device shown in FIG. 22 was fabricated according to the following steps.

Step 1: the gate electrode 1 was formed from aluminum to a thickness of 50 nm on a not-shown substrate.

Step 2: the gate insulating film 2 was formed from $SiO_2$ to a thickness of 100 nm on the gate electrode 1.

Step 3: a not-shown adhesive layer was formed from Cr to a thickness of 10 nm on the gate insulating layer 2.

Step 4: the source electrode 3 and the drain electrode 4 were formed from Au both to a thickness of 50 nm on the gate insulating layer 2 separated from each other by a distance of 40 nm.

Step 5: on the source electrode 3 and the drain electrode 4, and on the gate insulating layer 2 between the source electrode 3 and the drain electrode 4, a hole transporting organic semiconductor layer 5 was formed from poly-3-octylthiophene to a thickness of 80 nm from the top of the source electrode 3 and the drain electrode 4.

Step 6: on the organic semiconductor layer 5, the low resistance layer 6 was formed from Au to a thickness of 50 nm.

The device fabricated following the above steps had a channel length of 10 nm.

EXAMPLE 2

An active device the same as the active device 30 shown in FIG. 6 was fabricated following the same steps and using the same parameters as shown in example 1.

EXAMPLE 3

Figure 23:
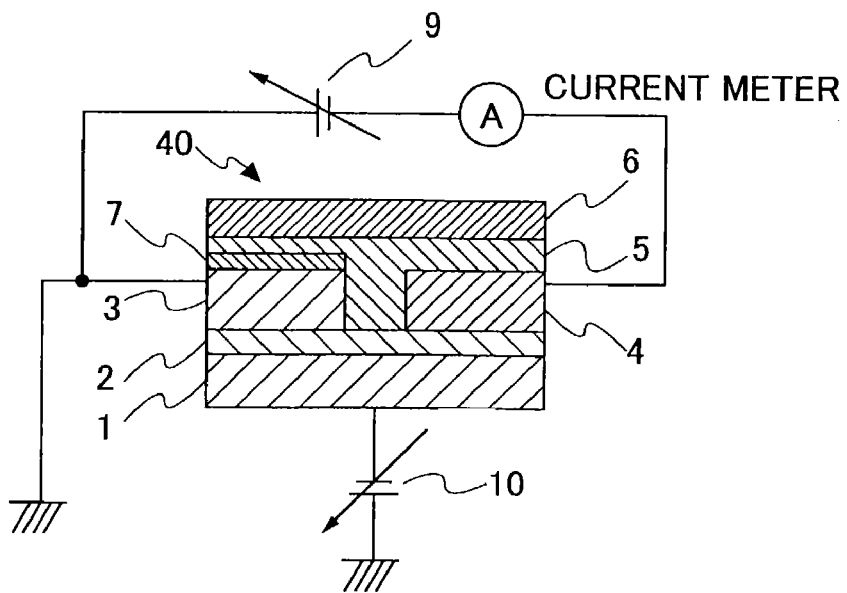
FIG. 23 is a partial sectional view of a third example of the active device of the present invention.

FIG. 23 is a partial sectional view of a third example of the active device of the present invention. The active device in FIG. 23 is the same as the active device 40 in FIG. 7.

The device shown in FIG. 23 was fabricated following the same steps using the same parameters as shown in example 1, except as follows. In fabrication of this device, the high resistance layer 7 was formed to 50 nm by coating a solution prepared by solving poly (vinyl butyral) into ethanol.

EXAMPLE 4

An active device of the same configuration as that shown in FIG. 23 was fabricated in a way different from that in example 3.

In this example, the device shown in FIG. 23 was fabricated according to the following steps.

Step 1: the gate electrode 1 was formed from aluminum to 30 nm on a not-shown substrate.

Step 2: the gate insulating film 2 was formed from $SiO_2$ to 100 nm on the gate electrode 1.

Step 3: a not-shown adhesive layer was formed from Cr to a thickness of 10 nm on the gate insulating layer 2 except in an area where the drain electrode 4 would be formed.

Step 4: first the source electrode 3 was formed from Al to 30 nm on the gate insulating layer 2, then after surface oxidation of the source electrode 3, a layer of $Al_2O_3$ is obtained acting as the high resistance layer 7.

Step 5: the drain electrode 4 was formed from Au to 20 nm on the gate insulating layer 2 in the area covered by the adhesive layer and separated from the source electrode 3 by a distance of 35 nm.

Step 6: on the source electrode 3 and the drain electrode 4, and on the gate insulating layer 2 between the source electrode 3 and the drain electrode 4, a hole transporting organic semiconductor layer 5 was formed from poly-3-octylthiophene to 80 nm from the top of the source electrode 3 and the drain electrode 4.

Step 7: on the organic semiconductor layer 5, the low resistance layer 6 was formed from Au to a thickness of 50 nm.

The device fabricated following the above steps had a channel length of 10 nm.

EXAMPLE 5

An active device the same as the active device 20a shown in FIG. 4 was fabricated following the same steps as shown in example 1.

The device shown in FIG. 4 was fabricated according to the following steps.

Step 1: the gate electrode 1 was formed from aluminum to a thickness of 50 nm on a not-shown substrate.

Step 2: the gate insulating film 2 was formed from $SiO_2$ to a thickness of 100 nm on the gate electrode 1.

Step 3: a not-shown-adhesive layer was formed from Cr to a thickness of 10 nm on the gate insulating layer 2.

Step 4: the source electrode 3 and the drain electrode 4 were formed from Au both to a thickness of 20 nm on the gate insulating layer 2 separated from each other by a distance of 40 nm.

Step 5: on the source electrode 3 and the drain electrode 4, and on the gate insulating layer 2 between the source electrode 3 and the drain electrode 4, an organic semiconductor layer 5a was formed to a thickness of 80 nm from the tops of the source electrode 3 and the drain electrode 4 from a material including an organic semiconductor material represented by the chemical formula shown in FIG. 5 and amounting to 90% by weight and a polycarbonate dielectric material dispersed in the organic semiconductor material and amounting to 10% by weight.

Step 6: on the organic semiconductor layer 5, the low resistance layer 6 was formed from Au to a thickness of 50 nm.

The device fabricated following the above steps had a channel length of 10 nm.

Example for Comparison

For comparison, a device including the active device shown in FIG. 27 was also fabricated. The fabrication procedure is the same as that shown in example 1 (FIG. 22), except the formation of the low resistance layer 6.

Performance Evaluation

The performance of the devices fabricated in the examples 1 through 5 as well as the example for comparison was measured.

(1). Examples 1 and 2

<Static Performance Measurement>

Setting the voltage of the first power supply 9 to be 0 V, 2 V, 4 V, and 8 V, respectively, and the voltage of the second power supply 10 to be 0 V, −4 V, and −8 V, respectively, the currents under various voltage conditions were measured.

(2). Example 3

<Static Performance Measurement>

Setting the voltage of the first power supply 9 to be 8 V, and the voltage of the second power supply 10 to be 0 V, and −8 V, respectively, the current under these voltage conditions was measured. Next, the voltage of the second power supply 10 was switched at a frequency of 1 Hz, and the current was measured after the device was driven continuously for 10 hours while being placed in a nitrogen flow.

(3). Example 4

<Static Performance Measurement>

Setting the voltage of the first power supply 9 to be 8 V, and the voltage of the second power supply 10 to be 0 V, and −8 V, respectively, the current under these voltage conditions was measured. Next, the voltage of the second power supply 10 was switched at a frequency of 1 Hz, and the current was measured after the device was driven continuously for 10 hours while being placed in a nitrogen flow.

(4). Example 5

<Static Performance Measurement>

Setting the voltage of the first power supply 9 to be 0 V, 2 V, 4 V, and 8 V, respectively, and the voltage of the second power supply 10 to be 0 V, −4 V, and −8 V, respectively, the currents under various voltage conditions were measured.

(5). Example for Comparison

<Static Performance Measurement>

Setting the voltage of the first power supply 9 to be 0 V, 4 V, 8 V, and 12 V, respectively, and the voltage of the second power supply 10 to be 0 V, −8 V, and −12 V, respectively, the currents under various voltage conditions were measured.

Results of the above measurements are summarized in tables in FIG. 24, FIG. 25, and FIG. 26.

While the present invention has been described with reference to specific embodiments chosen for purpose of illustration, it should be apparent that the invention is not limited to these embodiments, but numerous modifications could be made thereto by those skilled in the art without departing from the basic concept and scope of the invention.

Summarizing the effect of the invention, because the first resistance layer having an electrical resistance lower than that of the organic semiconductor layer is formed to cover the whole channel region, it is possible to make the channel short, and as a result, the distance that carriers have to move becomes short, and the probability for the carriers to be trapped becomes small. Therefore a greater current can be generated, and higher carrier mobility is obtainable. So, it is possible to realize fast switching and large current driving. According to the active device of the present invention, thin first electrodes and second electrodes result in not only a higher degree of integration but also lower current in the OFF state, and the thickness of the first electrode and the second electrode may be adjusted so that the ratio of the currents in the ON state and the OFF state becomes the maximum.

Further, since the organic semiconductor layer may include dielectric materials, when a gate voltage is applied to the active device of the present invention, the channel length can be made greater than the typical thickness of the first electrode and the second electrode of the active device, and as a result, when the low resistance layer is formed above the first electrode, the second electrode, and the organic semiconductor layer, the channel is in contact with the low resistance layer, enabling large current driving.

In addition, by including dielectric materials in the organic semiconductor layer, the resistance of the organic semiconductor layer increases, and resultantly, it becomes easy to control the magnitude of the current in the OFF state.

In addition, because both the distance from the first electrode to the first resistance layer and the distance from the second electrode to the first resistance layer are shorter than the distance between the source electrode and the drain electrode, it is possible to obtain a desired current to generate the ON state.

In addition, because either the first electrode or the second electrode is in contact with the first resistance layer, it is possible to make the channel length short.

In addition, because a second resistance layer is formed between the first electrode and the organic semiconductor layer, and/or between the second electrode and the organic semiconductor layer, and/or between the first resistance layer and the organic semiconductor layer, and carriers in the organic semiconductor layer are allowed to tunnel through the second resistance layer when a sufficiently high gate voltage is applied to the gate electrode, a large current is obtainable in the ON state, and the current in the OFF state can be reduced. Therefore, it is possible to obtain a high current ratio in ON/OFF states.

In addition, because one or more of the first electrode, the second electrode, and the first resistance layer is in contact with the organic semiconductor layer, and the contact interface is of rectification capability, it is possible to make the channel length short, and to obtain a high ON/OFF ratio.

In addition, because the first resistance layer is formed to have one of a plate shape, an inter-digital shape, a grating shape, and a disk shape, it is possible to reduce the current in the OFF state.

In addition, since the organic semiconductor layer is formed from organic materials, vaporization or coating can be used to form the organic semiconductor layer, effectively reducing the costs of the manufacturing equipment and the device.

In addition, since the first resistance layer is formed from conductive polymers, coating can be used to form this film, and this effectively reduces the costs of the manufacturing equipment and the device.

In addition, since the insulating layer is formed from polymers, coating or other techniques can be used to form this film. In addition, the insulating layer can be formed by surface oxidation of the electrode layer, and therefore, costs of the manufacturing equipment and the device can be reduced.

In addition, since the insulating layer is formed from metal oxide films obtained by coating or heat-drying the solution produced in hydrolysis of metal alkoxide, the insulating layer can be formed without the complicated vacuum processing, and therefore, costs of the manufacturing equipment and the device can be reduced.

In addition, since the second resistance layer is formed from polymers, coating or other techniques can be used to form this film. In addition, the second resistance layer can be formed by surface oxidation of the electrode layer, and therefore, costs of the manufacturing equipment and the device can be reduced.

In addition, since the second resistance layer is formed from metal oxide films obtained by coating or heat-drying the solution produced in hydrolysis of metal alkoxide, the second resistance layer can be formed without the complicated vacuum processing, and therefore, costs of the manufacturing equipment and the device can be reduced.

According to the EL display device of the present invention, since active devices as described above are included, it is possible to provide an EL display device at low cost but with good visibility and low power consumption.

According to the liquid crystal display device of the present invention, since active devices as described above are included, it is possible to provide a liquid crystal display device at low cost but with good visibility and low power consumption.

According to the calculating device of the present invention, because semiconductor devices described above are included into a NOT circuit, a NAND circuit, and a NOR circuit, and further the NOT circuit inverts the input voltage, the NAND circuit inverts the logic AND, and the NOR circuit inverts the logic OR, it is possible to provide a calculating device at low cost and that is able to perform calculation using the input signals and output the calculation results.

This patent application is based on Japanese priority patent applications No. 2002-212685 filed on Jul. 22, 2002, No. 2003-166765 filed on Jun. 11, 2003, and No. 2003-190877 filed on Jul. 3, 2003, the entire contents of which are hereby incorporated by reference.

What is claimed is:

1. A semiconductor device, comprising:
   a gate electrode;
   an insulating layer on the gate electrode;
   a first electrode on the insulating layer;
   a second electrode on the insulating layer at an interval with the first electrode;
   an organic semiconductor layer disposed in the interval between the first electrode and the second electrode, covering and contacting at least part of the first electrode and the second electrode; end
   a first resistance layer formed on the organic semiconductor layer and having an electrical resistance lower than an electrical resistance of the organic semiconductor layer; and
   a second resistance layer formed at least at one of the position between the first resistance layer and the organic semiconductor layers the position between the first electrode and the organic semiconductor layer, and the position between the second electrode and the organic semiconductor layer,
   wherein the first resistance layer is formed from a metal selected from the group consisting of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), or tin (Sn), and
   wherein the second resistance layer has an electrical resistance so that carriers in the organic semiconductor layer am allowed to tunnel through the second resistance layer when a voltage of a predetermined value or more than the predetermined value is applied across the second resistance layer.

2. The semiconductor device as claimed in claim 1, wherein both a distance from the first electrode to the first resistance layer and a distance from the second electrode to the first resistance layer are shorter than the interval between the first electrode and the second electrode.

3. The semiconductor device as claimed in claim 1, wherein
   at least one of the first electrode, the second electrode and the first resistance layer is in contact with the organic semiconductor layer; and
   an interface between one of the first electrode, the second electrode and the first resistance layer rectifies an electrical current therethrough.

4. The semiconductor device as claimed in claim 1, wherein the first resistance layer is formed to be one of a plate shape, an inter-digital shape, a grating shape, and a disk shape.

5. The semiconductor device as claimed in claim 1, wherein a substrate is beneath the gate electrode.

6. The semiconductor device as claimed in claim 1, wherein the organic semiconductor layer is formed from
   at least one organic material selected from the group consisting of poly(N-vinylcarbazole) derivatives, poly (γ-(carbazolylethyl)glutamate) derivatives, poly(vinylphenanthrene) derivatives, polysilane derivatives, oxazole derivatives, oxadiazole derivatives, imidazole derivatives, arylamine derivatives such as monoarylamine derivatives and triarylamine derivatives, benzidine derivatives, diarylmethane derivatives, triarylmethane derivatives, styrylanthracene derivatives, pyrazoline derivatives, divinylbenzene derivatives, hydrazone derivatives, indene derivatives, indenone derivatives, butadiene derivatives, pyrene derivatives such as pyrene-folmaldehyde and poly(vinylpyrene), stilbene derivatives such as α-phenylstilbene derivatives, and bis-stilbene derivatives, enamine derivatives, fluorenone and derivatives thereof, poly(fluorenone) and derivatives thereof, and thiophene derivatives such as poly(alkylthiophene), or at least one organic material selected from the group consisting of pentacene, tetracene, bis-azo pigments, tris-azo pigments, poly-azo pigments, triarylmethane-based pigments, thiazine-based pigments, oxazine-based pigments, xanthene-based pigments, cyanine pigments, styryl pigments, pyrylium-based pigments, quinacridone-based pigments, indigo-based pigments, perylene-based pigments, polycyclic quinone-based pigments, bis(benzimidazole)-based pigments, indanthrone-based pigments, squarylium-based pigments, anthraquinone-based pigments, and phthalocyanine-based pigments such as copper phthalocyanine and titanylphthalocyanine.

7. The semiconductor device as claimed in claim 1, wherein each of the first electrode, the second electrode, and the gate electrode is formed from at least one of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn), or at least one electrically conductive polymer of polyacetylene-based electrically conductive polymers, polyphenylene-based electrically conductive polymers such as poly(para-phenylene) and derivatives thereof and poly(phenylene vinylene) and derivatives thereof, heterocyclic electrically conductive polymers such as polypyrrole and derivatives thereof, polythiophene and derivatives thereof, poly(ethylenedioxythiophene) and derivatives thereof, and polyfuran and derivatives thereof, and ionic electrically conductive polymers such as polyaniline and derivatives thereof.

8. The semiconductor device as claimed in claim 1, wherein the insulating layer is formed from at least one resin selected from the group consisting of thermoplastic resins such as styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or a metal oxide produced via oxidation of a surface of an electrode layer formed from the metal.

9. The semiconductor device as claimed in claim 1, wherein the insulating layer is formed from at least a metal oxide film produced by coating and baking a solution obtained via hydrolysis of a metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

10. The semiconductor device as claimed in claim 1, wherein the second resistance layer is formed from at least one resin selected from the group consisting of thermoplastic resins such as styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or a metal oxide produced via oxidation of a surface of at least one of the first electrode and the second electrode.

11. The semiconductor device as claimed in claim 1, wherein the second resistance layer is formed from at least a metal oxide film produced by coating and baking a solution obtained via hydrolysis of a metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

12. The semiconductor device as claimed in claim 1, further comprising:

a first power supply conducting a current between the first electrode and the second electrode; and a second power supply applying a voltage to the gate electrode.

13. The semiconductor device as claimed in claim 1, wherein the organic semiconductor layer includes a dielectric material.

14. The semiconductor device as claimed in claim 13, wherein the dielectric material is selected from styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, a metal oxide film produced by baking a solution obtained via hydrolysis of a metal alkoxide represented by one of the general formulas $M(OR)_n$ and $MR(OR')_{n-1}$, in which each of R and R' is an organic group such as an alkyl group and a phenyl group, M is a metal in one of IVA through VIIA groups, VIII group, and IB through VIB groups of the periodic table, and n is an ionic valence of the metal M, an oxide of one of Al, Ta, and W, Si, and
a nitride of Si.

15. A liquid crystal display device, comprising a semiconductor device including:
a gate electrode;
an insulating layer on the gate electrode;
a first electrode on the insulating layer;
a second electrode on the insulating layer at an interval with the first electrode;
an organic semiconductor layer disposed in the interval between the first electrode and the second electrode, covering and contacting at least part of the first electrode and the second electrode; and
a first resistance layer formed on the organic semiconductor layer and having an electrical resistance lower than an electrical resistance of the organic semiconductor layer,
wherein one of the first electrode and the second electrode is in contact with the first resistance layer.

16. A calculating device, comprising at least one of a NOT circuit, a NAND circuit, and a NOR circuit each including a plurality of semiconductor devices,
each of the semiconductor devices including:
a gate electrode;
an insulating layer on the gate electrode;
a first electrode on the insulating layer;
a second electrode on the insulating layer at an interval with the first electrode;
an organic semiconductor layer disposed in the interval between the first electrode and the second electrode, covering and contacting at least part of the first electrode and the second electrode; and
a first resistance layer formed on the organic semiconductor layer and having an electrical resistance lower than an electrical resistance of the organic semiconductor layer,
wherein one of the first electrode and the second electrode is in contact with the first resistance layer.

17. A semiconductor device, comprising:
a gate electrode;
an insulating layer on the gate electrode;
a first electrode on the insulating layer;
a second electrode on the insulating layer at an interval with the first electrode;
an organic semiconductor layer disposed in the interval between the first electrode and the second electrode, covering and contacting at least part of the first electrode and the second electrode; and
a first resistance layer formed on the organic semiconductor layer and having an electrical resistance lower than an electrical resistance of the organic semiconductor layer,
wherein one of the first electrode and the second electrode is in contact with the first resistance layer.

18. The semiconductor device as claimed in claim 17, further comprising:
a second resistance layer formed at least at one of the position between the first resistance layer and the organic semiconductor layer, the position between the first electrode and the organic semiconductor layer, and the position between the second electrode and the organic semiconductor layer,
wherein the second resistance layer has an electrical resistance so that carriers in the organic semiconductor layer are allowed to tunnel through the second resistance layer when a voltage of a predetermined value or more than the predetermined value is applied across the second resistance layer.

19. The semiconductor device as claimed in claim 18, wherein the second resistance layer is formed from at least one resin selected from the group consisting of:
thermoplastic resins such as styrene-based polymers such as copoly(styrene/butadiene), copoly(styrene/acrylonitrile), terpoly(styrene/acrylonitrile/butadiene), copoly (styrene/maleic acid), and copoly(styrene/acrylic acid), polyethylene-based resins such as copoly(ethylene/vinyl acetate), and chlorinated polyethylenes, polypropylene, vinyl chloride-based resins such as copoly (vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or
a metal oxide produced via oxidation of a surface of at least one of the first electrode and the second electrode.

20. The semiconductor device as claimed in claim 18, wherein the second resistance layer is formed from at least a metal oxide film produced by coating and baking a solution obtained via hydrolysis of a metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

21. The semiconductor device as claimed in claim 17, wherein
at least one of the first electrode, the second electrode and the first resistance layer is in contact with the organic semiconductor layer; and
an interface between one of the first electrode, the second electrode and the first resistance layer rectifies an electrical current therethrough.

22. The semiconductor device as claimed in claim 17, wherein the first resistance layer is formed to be one of a plate shape, an inter-digital shape, a grating shape, and a disk shape.

23. The semiconductor device as claimed in claim 17, wherein a substrate is beneath the gate electrode.

24. The semiconductor device as claimed in claim 17, wherein the organic semiconductor layer is formed from
at least one organic material selected from the group consisting of poly(N-vinylcarbazole) derivatives, poly (γ-(carbazolylethyl)glutamate) derivatives, poly(vinylphenanthrene) derivatives, polysilane derivatives, oxazole derivatives, oxadiazole derivatives, imidazole derivatives, arylamine derivatives such as monoarylamine derivatives and triarylamine derivatives, benzidine derivatives, diarylmethane derivatives, triarylmethane derivatives, styrylanthracene derivatives, pyrazoline derivatives, divinylbenzene derivatives, hydrazone derivatives, indene derivatives, indenone derivatives, butadiene derivatives, pyrene derivatives such as pyrene-folmaldehyde and poly(vinylpyrene), stilbene derivatives such as α-phenylstilbene derivatives, and bis-stilbene derivatives, enamine derivatives, fluorenone and derivatives thereof, poly(fluorenone) and derivatives thereof, and thiophene derivatives such as poly(alkylthiophene), or at least one organic material selected from the group consisting of pentacene, tetracene, bis-azo pigments, tris-azo pigments, poly-azo pigments, triarylmethane-based pigments, thiazine-based pigments, oxazine-based pigments, xanthene-based pigments, cyanine pigments, styryl pigments, pyrylium-based pigments, quinacridone-based pigments, indigo-based pigments, perylene-based pigments, polycyclic quinone-based pigments, bis(benzimidazole)-based pigments, indanthrone-based pigments, squarylium-based pigments, anthraquinone-based pigments, and phthalocyanine-based pigments such as copper phthalocyanine and titanylphthalocyanine.

25. The semiconductor device as claimed in claim 17, wherein the first resistance layer is formed from at least one electrically conductive material of polyacetylene-based electrically conductive polymers, polyphenylene-based electrically conductive polymers such as poly(para-phenylene) and derivatives thereof and poly(phenylene vinylene) and derivatives thereof, heterocyclic electrically conductive polymers such as polypyrrole and derivatives thereof, polythiophene and derivatives thereof, poly(ethylenedioxythiophene) and derivatives thereof, and polyfuran and derivatives thereof, ionic electrically conductive polymers such as polyaniline and derivatives thereof, and metals of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn).

26. The semiconductor device as claimed in claim 17, wherein the first resistance layer comprises at least one dopant with a low vapor pressure including one or more of poly(sulfonic acid), poly(styrenesulfonic acid), naphthalenesulfonic acid, and alkylnaphthalenesulfonic acid.

27. The semiconductor device as claimed in claim 17, wherein each of the first electrode, the second electrode, and the gate electrode is formed from at least one of chromium (Cr), tantalum (Ta), titanium (Ti), copper (Cu), aluminum (Al), molybdenum (Mo), tungsten (W), nickel (Ni), gold (Au), palladium (Pd), platinum (Pt), silver (Ag), and tin (Sn), or at least one electrically conductive polymer of polyacetylene-based electrically conductive polymers, polyphenylene-based electrically conductive polymers such as poly(para-phenylene) and derivatives thereof and poly (phenylene vinylene) and derivatives thereof, heterocyclic electrically conductive polymers such as polypyrrole and derivatives thereof, polythiophene and derivatives thereof, poly(ethylenedioxythiophene) and derivatives thereof, and polyfuran and derivatives thereof, and ionic electrically conductive polymers such as polyaniline and derivatives thereof.

28. The semiconductor device as claimed in claim 17, wherein the insulating layer is formed from at least one resin selected from the group consisting of thermoplastic resins such as styrene-based polymers such as copoly(styrene/butadiene), copoly(styrene/acrylonitrile), terpoly(styrene/acrylonitrile/butadiene), copoly(styrene/maleic acid), and copoly(styrene/acrylic acid), polyethylene-based resins such as copoly(ethylene/vinyl acetate), and chlorinated polyethylenes, polypropylene, vinyl chloride-based resins such as copoly(vinyl chloride/vinyl acetate), polyester alkyd resins, polyamides, polyurethanes, polycarbonates, polyallylates, polysulfones, diallyl phthalate resin, poly(vinylbutyral) resin, polyether resins, polyester resins, acrylic resin, silicone resin, epoxy resins, phenolic resin, urea resin, melamine resin, fluorocarbon resins such as PFA, PTFE, and PVDF, Parylene resin, polyimide resins, and photo-setting resins such as epoxyacrylates and urethane acrylates, or a metal oxide produced via oxidation of a surface of an electrode layer formed from the metal.

29. The semiconductor device as claimed in claim 17, wherein the insulating layer is formed from at least a metal oxide film produced by coating and baking a solution obtained via hydrolysis of a metal alkoxide represented by one of the general formulas $M(OR)_n$ and $MR(OR')_{n-1}$, wherein each of R and R' is an organic group such as an alkyl group and a phenyl group, M is a metal in one of IVA through VIIA groups, VIII group, and IB through VIB groups of the periodic table, and n is an ionic valence of the metal M.

30. The semiconductor device as claimed in claim 17, further comprising:

a first power supply conducting a current between the first electrode and the second electrode; and a second power supply applying a voltage to the gate electrode.

* * * * *